(12) United States Patent
Ikeya et al.

(10) Patent No.: US 7,447,045 B2
(45) Date of Patent: Nov. 4, 2008

(54) BOARD SUPPORTING MECHANISM, BOARD SUPPORTING METHOD, AND COMPONENT MOUNTING APPARATUS AND COMPONENT MOUNTING METHOD USING THE SAME MECHANISM AND METHOD

(75) Inventors: Keishi Ikeya, Yamanashi (JP); Kazuo Kido, Yamanashi (JP); Tetsutaro Hachimura, Fukuoka (JP); Hideki Uchida, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/480,355

(22) Filed: Jul. 5, 2006

(65) Prior Publication Data
US 2007/0008709 A1    Jan. 11, 2007

(30) Foreign Application Priority Data
Jul. 7, 2005    (JP)    ............................. 2005-198479

(51) Int. Cl.
*H05K 7/14* (2006.01)

(52) U.S. Cl. .................. 361/807; 361/742; 361/758; 361/770; 361/804; 361/810; 174/138 E; 174/138 G; 174/520; 29/830

(58) Field of Classification Search .................. 29/703, 29/729, 760, 832, 837, 830; 269/54.5; 361/807–810, 361/811, 742, 758, 770, 804; 211/41.17; 174/250, 260, 138 G, 138 E, 520
See application file for complete search history.

(56) References Cited

U.S. PATENT DOCUMENTS
5,157,438 A * 10/1992 Beale ........................... 355/72
(Continued)

FOREIGN PATENT DOCUMENTS
JP    5-191078    7/1993
(Continued)

OTHER PUBLICATIONS
Nefitco website, found at www.nefitco.com/interlockingfloormats38.html, archived at http://web.archive.org/web/20050402145740/www.nefitco.com/interlockingfloormats38.html on Mar. 25, 2005.*

*Primary Examiner*—Dean A. Reichard
*Assistant Examiner*—Dameon E Levi
(74) *Attorney, Agent, or Firm*—Wenderoth, Lind & Ponack, L.L.P.

(57) ABSTRACT

A board supporting mechanism and a board supporting method eliminating an adjustment of a support height of a support pin upon position-changing of the support pin in accordance with a change in the model of a circuit board, as well as a component mounting apparatus and a component mounting method. A single or a plurality of support pin(s) (42) have one end(s) and are brought into contact with a bottom face of a circuit board (14) to support the bottom face of the circuit board (14) and the other end(s) are brought into contact with a surface of a support table (27) for raising/lowering the support pin(s) (42). Each support pin is held in a direction substantially perpendicular to the surface of the support table (27). The one end(s) of the support pin (42), held in the direction substantially perpendicular to the surface of the support table (27), is brought into contact with the bottom face of the circuit board (14), and thereby, the support pins support the circuit board (14).

7 Claims, 9 Drawing Sheets

U.S. PATENT DOCUMENTS

| | | | |
|---|---|---|---|
| 5,274,292 A * | 12/1993 | Lemmer et al. | 310/233 |
| 5,479,861 A * | 1/1996 | Kinchin | 102/439 |
| 5,492,429 A * | 2/1996 | Hodges | 403/372 |
| 5,675,192 A * | 10/1997 | Ashley et al. | 307/17 |
| 5,794,329 A * | 8/1998 | Rossmeisl et al. | 29/743 |
| 5,825,630 A * | 10/1998 | Taylor et al. | 361/790 |
| 5,835,658 A * | 11/1998 | Smith | 385/136 |
| 6,061,903 A * | 5/2000 | Lees et al. | 29/837 |
| 6,071,756 A * | 6/2000 | Sines et al. | 438/107 |
| 6,158,727 A * | 12/2000 | Fox | 269/20 |
| 6,438,822 B1 * | 8/2002 | Hattori | 29/739 |
| 6,578,260 B1 * | 6/2003 | Dixon et al. | 29/830 |
| 6,585,245 B2 * | 7/2003 | Isogai et al. | 269/21 |
| 6,726,195 B1 * | 4/2004 | Hertz et al. | 269/266 |
| 6,757,179 B2 * | 6/2004 | Barsun et al. | 361/807 |
| 2002/0013100 A1 * | 1/2002 | Brownell et al. | 439/625 |
| 2003/0041448 A1 * | 3/2003 | Van Deursen | 29/760 |
| 2004/0012931 A1 * | 1/2004 | Pitzele | 361/748 |
| 2004/0169172 A1 * | 9/2004 | Stringer et al. | 256/67 |

FOREIGN PATENT DOCUMENTS

| | | |
|---|---|---|
| JP | 2004-335973 | 11/2004 |

* cited by examiner

BOARD SUPPORTING MECHANISM, BOARD SUPPORTING METHOD, AND COMPONENT MOUNTING APPARATUS AND COMPONENT MOUNTING METHOD USING THE SAME MECHANISM AND METHOD

BACKGROUND OF THE INVENTION

The present invention relates to: a board supporting mechanism; a board supporting method; a component mounting apparatus utilizing the board supporting mechanism, and a component mounting method utilizing the board supporting method to mount a component on a circuit board; a viscous material applying apparatus and a viscous material applying method for applying a viscous material such as cream solder, adhesive, or silver paste onto a circuit board; a support pin; and a pin-erecting guide plate. More specifically, the present invention relates to: a board supporting mechanism and a board supporting method capable of supporting a circuit board from a bottom side thereof upon mounting a component or upon applying a viscous material; a component mounting apparatus and a viscous material applying apparatus respectively utilizing the board supporting mechanism and a component mounting method and a viscous material applying method respectively utilizing the board supporting method; a support pin; and a pin-erecting guide plate.

FIG. 11 illustrates one example of a component mounting apparatus. As illustrated in FIG. 11, the component mounting apparatus 101 includes a component supplying section 102 for supplying components to be mounted, a mounting head 104 for taking out the component from the component supplying section 102 by utilizing a suction nozzle 103 and mounting the component on a circuit board 114, a transfer robot 105 for transferring the mounting head 104 to a predetermined position, a component recognizing device 106 for picking up an image of the component held by the suction nozzle 103 to recognize a position and an angular deviation thereof, a board holding device 107 for carrying in and holding the circuit board 114, and a control section 109 for controlling general operations.

When the component mounting apparatus 101 configured as described above is actuated, the mounting head 104, transferred by the transfer robot 105, is moved to a position facing a component supplying device 108 provided on the component supplying section 102, and allowed to take a component out of the component supplying device 108 by utilizing the suction nozzle 103. Then, the suction nozzle 103 is moved to a position facing the component recognizing device 106 by the movement of the mounting head 104, so that the holding state of the component including the position and the angular deviation of the component that has been suction-held is recognized.

In these operations, a circuit board 114 is carried in the component mounting apparatus 101, and position-held at a predetermined mountable position by the board holding device 107. The mounting head 104 with the component being held by the suction nozzle 103 is transferred by the transfer robot 105 and moved to a position facing a top face of the circuit board 114. A board recognizing device 115 attached to the mounting head 104 picks up an image of the circuit board 114 to recognize a position and an angular deviation thereof, and transmits the results of recognition to the control section 109. The control section 109 has preliminarily read NC data in which component mounting positions of respective components to be mounted onto the circuit board 114 have been recorded. Based on the state of the component inputted from the component recognizing device 106 and the state of the circuit board 114 inputted from the board recognizing device 115, the control section 109 instructs to carry out necessary corrections with respect to the position and the angle of the suction nozzle 103.

Based on the instructions, the mounting head 104 corrects the position and the angle of the component 110, and mounts the component 110 on the component mounting position on the circuit board 114 by utilizing the suction nozzle 103. After the component 110 mounting, the mounting head 104, again transferred by the transfer robot 105, is moved to the position facing the component supplying device 108, and thereafter, the aforementioned operations are repeated. After having finished mounting all the predetermined components, the circuit board 114 is carried out of the component mounting apparatus 101 by the board holding device 107, and the next circuit board 114 is carried in, so that the aforementioned operations are repeated.

FIG. 12 illustrates the board holding device 107 for holding the circuit board 114 at the mountable position, and herein, one portion on the front side is exploded. In FIG. 12, the circuit board 114 is held by a pair of rail units 121 that are extended in an X1 direction and made face to face with each other. Grooves 122 are formed in the respective rail units 121 so as to be made face to face with each other, and flat belts 123 are extended to pass along the grooves 122 so as to move therein. In FIG. 12, the flat belt 123 is illustrated as two portions, which are connected to each other at two ends in the X1 direction, not illustrated, to form an endless belt, and engaged with a driving source such as a motor. The circuit board 114, the two ends of which are fitted to the paired grooves 122 facing each other, is placed on the paired flat belts 123, and can be moved and transferred in the X1 direction in FIG. 11.

One of the rail units 121 (for example, one on the right side of FIG. 12) is allowed to move in the direction opposing to the other rail unit 121 (the other one being on the left side) (in a Y1 direction), and by this movement of the one rail unit 121, it becomes possible to transfer and hold circuit boards 114 having various width dimensions. A reference rail 124 having an L-shaped cross section is secured to a main rail 125 on the top face of each of the rail units 121 by securing pins 126. The face (bottom face) of the L-shaped reference rail 124 on the side opposing to the circuit board 114 restricts the upward movement of the circuit board 114, and forms an upward reference face in a Z1 direction with respect to the circuit board 114 at the time of mounting a component.

A support table 127 is positioned below the two rail units 121, and a pin supporting plate 130, made of metal and placed on the support table 127, holds a plurality of support pins 128 each made of metal in the Z1 direction of FIG. 12. As will be described later, the support pins 128 are brought into contact with the bottom face of the circuit board 114 so as to support the circuit board 114 from the bottom side thereof against load and vibration at the time of mounting a component.

The board holding device 107 having the aforementioned structure is operated in the following manner. First, when a circuit board 114 is carried in the component mounting apparatus 101 by a loader, not illustrated, the endless flat belts 123 of the board holding device 107, which rotate in synchronization with the loader, carry the circuit board 114 and transfer the circuit board 114 to a mountable position. At a movement restricting position adjacent to the mountable position, a drawing-type stopper 116 protrudes in a manner so as to block the progressing path of the circuit board 114. When the transferred circuit board 114 comes into contact with the stopper 116, the circuit board 114 is positioned at the mountable position, and the flat belts 123 are also stopped simultaneously.

Next, the cylinder 119, which supports the support table 127 beneath the support table 127 so as to be freely raised and lowered, extends so that the support table 127 is raised, and the circuit board 114 is raised upward together with the holding rails 129 housing the flat belts 123. With this arrangement, the top face of the circuit board 114 is made in close-contact with the reference face forming the bottom faces of the reference rails 124, so that the circuit board 114 is positioned in the Z1 direction. Simultaneously, the plurality of support pins 128 attached to the pin supporting plate 130 come into contact with the bottom face of the circuit board 114 to support the circuit board 114 from the bottom side thereof, so that the circuit board 114 is supported so as to endure load and vibration applied at the time of mounting components 110.

With respect to the operation of the board supporting device 107 after mounting the components 110, in a manner reversed to the aforementioned operation, the cylinder 119 shrinks and the support table 127 is consequently lowered, so that the upward pressing force to the circuit board 114 by the flat belts 123 is released, and the supporting force applied to the circuit board 114 by the support pins 128 from the bottom side thereof is simultaneously released. Next, the flat belts 123 are again driven so that the circuit board 114 is further moved rearward in FIG. 12, and carried by an unloader, not illustrated, which is synchronously driven, and carried out of the component mounting apparatus 101. Simultaneously, the next circuit board 114 is carried by the flat belts 123 and transferred into the mountable position. Upon transferring the circuit board 114 out, the stopper 116 is once retracted downward to allow the circuit board 114 to move, and after the carrying-out process, the stopper 116 is again made face to face with the next circuit board 114 so as to protrude toward the movement restricting position.

The number of the support pins 128 to be attached to the pin supporting plate 130 is made different depending on various dimensions such as a plate thickness and an area of the circuit board 114 to be supported. In the case of a circuit board having a large plate thickness with a high degree of rigidity, the support pins 128 could be omitted in some cases; in contrast, in the case of a circuit board 114 having a small plate thickness with a wide width, a number of support pins 128 could be placed, for example, a 10 to 15 mm pitch might be used.

Moreover, in the case where, as illustrated in FIG. 12, a component 110, which has already been mounted on the bottom face of the circuit board 114, is present, the support pin 128 is not attached to a corresponding position of the pin supporting plate 130 (indicated by a vacant pin inserting hole 131) so as to avoid interference of the mounted component 110 with the support pin 128. Therefore, in response to the size of the circuit board 114 and the component mounting state onto the bottom face, each time the model changes in the circuit board 114 to be produced, a setup for changing the layout of the support pins 128 is required.

The support table 127 is secured to the component mounting apparatus 101 through the cylinder 119, and the surface of the support table 127 facing the circuit board 114 is adjusted so as to be in parallel with the bottom faces of the pair of reference rails 124 that position-restrict the circuit board 114 from above. The surface of the pin supporting plate 130 to be placed on the support table 127 is also secured so as to be in parallel with the bottom faces of the pair of reference rails 124 in the same manner so that this structure allows the respective support pins 128 attached to the pin supporting plate 130 to support the bottom face of the circuit board 114 from the bottom side thereof with even loads.

FIG. 13 illustrates each support pin 128. As illustrated in FIG. 13, the support pin 128 is constituted by a support portion 128a, a step portion 128b, and a securing portion 128c, which are generally formed into a cylinder shape. The tip of the support portion 128a is brought into contact with the bottom face of the circuit board 114 so as to support the circuit board 114, and the securing portion 128c, located on the opposite side, is inserted into each pin inserting hole 131 (see FIG. 12) that is formed in the pin supporting plate 130 so that the entire support pin 128 is supported in a direction substantially perpendicular to the surface of the pin supporting plate 130. In this case, the step portion 128b serves as a stopper while a bottom face portion 128d thereof is brought into contact with a region 132 around the pin inserting hole 131 on the surface of the pin supporting plate 130 so that a support height "h" from the surface of the pin supporting plate 130 (that is, the bottom face portion 128d of the step portion 128b) to the tip of the support portion 128a is defined. In this case, the support height "h" corresponds to a height at which the support table 127 has been raised to reach an upper dead center thereof. Here, in the example illustrated in FIG. 12, the support pin 128 is secured to the pin supporting plate 130 only by inserting the securing portion 128c so as to provide a sufficient attaching strength; however, the securing portion 128c may be threaded and engaged with a screw hole 131 on the pin supporting plate 130 side, if necessary.

The above explanation has been given in association with the component mounting apparatus 101; however, the same explanation is also given to a viscous material applying apparatus used for applying a viscous material such as cream solder. In other words, in place of the component, the aforementioned viscous material is supplied to the supplying section. In place of the suction nozzle 103, an applying nozzle is installed, and in place of the mounting head 104, an applying head is installed. However, except for the aforementioned points, the completely common structure and operation of the board holding device 107, in particular illustrated in FIG. 12, may be used between the two devices. Therefore, the following description will also be given by exemplifying the component mounting apparatus 101, unless otherwise required.

Here, in the conventional art, a support pin of the following type has been proposed in which, in order to easily attach the support pin 128 and strengthen the support by the pin supporting plate 130, notches are given to the step portion 128b and the securing portion 128c of the support pin 128 in the longitudinal direction so as to exert an elastic force (for example, Patent Document 1; see JP-A 05-191078). Moreover, another support pin of the following type has been proposed in which the entire support pin 128 is formed by an elastic body so that, when a preliminarily mounted component 110 is present on the circuit board 114, the support pin 128 is deformed by elastic property of the support pin 128 to avoid interference with the component 110. In this case, irrespective of the presence or absence of the mounted component 110, the support pins 128 may be left in their attached state (for example, Patent Document 2; see JP-A 2004-335973).

As described above, upon changing the model of the circuit board 114 during production, it is necessary to make a setup for changing the layout of the support pins 128 attached to the pin supporting plate 130 (in the case of the elastic body support pins also, it is necessary to change the layout depending on the width, length, and the like of the circuit board 114). One of the setups that have been made conventionally is a method in which support pins 128 are disassembled from the support table 127 together with the pin supporting plate 130 and transferred out of the component mounting apparatus 101 so that position-changing processes of the attached support pins 128 are carried out outside of the component mounting apparatus 101. One of the advantages of this method is that better operability is available in comparison with the method in which the position-changing of the support pins 128 is carried out inside the component mounting apparatus 101 that is limited in space, and it is possible to conduct efficient operations. Another advantage is that a so-called off-line setup is made in which a pin supporting plate 130, which has support pins 128 preliminarily laid out in accordance with the next model, is prepared, and the pin supporting plate 130 with the support pins 128 is attached to the support table 127 and while the manufacturing processes are carried out, the position-changing of the support pins 128 corresponding to the next model is conducted outside the component mounting apparatus 101.

In contrast, one of the disadvantages of this method is that the pin supporting plate 130 with a number of support pins 128 being attached thereto needs to be taken out of the component mounting apparatus 101, and thereafter, the pin supporting plate 130 with the support pins 128 needs to be again attached to the component mounting apparatus 101 upon mounting a component. In general, in order to make the pin supporting plate 130 lighter, the pin supporting plate 130 is made of aluminum; however, the resulting plate becomes as heavy as several tens of kilograms as a whole, and the operator has to enter a narrow space inside the component mounting apparatus 101 and take the pin supporting plate 130 out of the component mounting apparatus 101. Moreover, upon attaching the pin supporting plate 130, since the top face of the pin supporting plate 130 forms a reference face to the height of the support pins 128, the pin supporting plate 130 needs to be attached to the support table 127 while carrying out fine height adjustments so as to make the reference face parallel with the circuit board 114 (that is, the bottom face of the reference rail 124), with the result that an increased number of processes are required.

In the system of Patent Document 1 which forms the slit-shaped notch in the support pin 128 so as to provide the elastic property, although improvements can be achieved to a certain degree in comparison with the conventional solid structure, considerable labor is required for the attaching and detaching processes of the support pins 128. Moreover, in the system of Patent Document 2 which prepares the support pin 128 itself as an elastic body, depending on the amount of protrusion of the mounted component 110, the deformation of the component 110 and influences to adjacent components due to the elastic force of the support pin 128 tend to be caused, with the result that it is sometimes difficult to properly select a material having a suitable elastic force as the support pin 128. Furthermore, in both of Patent Documents 1 and 2, the structure in which, in order to support the circuit board 114, the step portion 128b is formed on the support pin 128 so that the support height "h" is determined by taking the surface of the pin supporting plate 130 as a reference is required in the same manner.

SUMMARY OF THE INVENTION

In order to solve the aforementioned issues in the conventional art, an object of the present invention is to provide: a board supporting mechanism and a board supporting method, a component mounting apparatus and a viscous material applying apparatus utilizing the board supporting mechanism and a component mounting method and a viscous material applying method utilizing the board supporting method; a support pin; and a pin-erecting guide plate, capable of making adjustment for the support height of a support pin unnecessary upon changing a position of a support pin in accordance with a change in model of a circuit board to carry out a setup for model changes in the circuit board in a considerably efficient manner.

According to the present invention, a plate (referred to as a pin-erecting guide plate in the present invention) securing a support pin is made of an elastic material such as rubber or plastic so that the support pin is held by utilizing an elastic force of the plate. According to the present invention, moreover, there is utilized not a surface of a plate but a surface of a support table, as a reference of a support height of a support pin; thus, it becomes possible to solve the issues in the conventional art, and the present invention specifically includes the following contents.

That is, one aspect of the present invention relates to a board supporting method for supporting a circuit board, held by a board holding device, from a bottom side thereof upon processing the circuit board, comprising: bringing one end of at least one support pin into contact with a bottom face of the circuit board to support the bottom face of the circuit board, bringing the other end of the support pin into contact with a surface of a support table for raising/lowering the support pin, holding the support pin in a direction substantially perpendicular to the surface of the support table, and supporting the circuit board.

The support pin is inserted into and passes through a pin-erecting though-hole of a pin-erecting guide plate secured onto the surface of the support table and the other end of the support pin is brought into contact with the surface of the support table, so that the support pin can be held in the direction substantially perpendicular to the pin-erecting guide plate.

The pin-erecting guide plate is made of any one of an elastic body, a plastic material, and a combination of an elastic body with a plastic material, and the support pin may be held in the direction substantially perpendicular to the support table by an elastic force of the pin-erecting guide plate.

When the support pin and the pin erecting guide plate are changed together with new ones in accordance with a change in model of the circuit board, the support pin may be held in the pin-erecting through-hole of the pin-erecting guide plate while being prevented from slip-off.

In addition, a positioning pin erected on the surface of the support table is fitted into a positioning hole formed in the pin-erecting guide plate, so that the pin-erecting guide plate may be placed on the support table and the pin-erecting guide plate may be fixedly positioned onto the support table.

Another aspect of the present invention relates to a component mounting method for mounting a component supplied from a component supplying section on a component mounting position of a position-held circuit board, comprising: when the circuit board is position-held upon mounting the component thereon, utilizing the aforementioned board supporting method to support the circuit board from a bottom side thereof.

Still another aspect of the present invention relates to a viscous material applying method for applying a viscous material supplied from a viscous material supplying section to a position-held circuit board, comprising: when the circuit board is position-held upon applying the viscous material thereto, utilizing the aforementioned board supporting method to support the circuit board from a bottom side thereof.

Yet another aspect of the present invention relates to a pin-erecting guide plate for holding at least one support pin, having one end brought into contact with a surface of a raising/lowering support table and the other end brought into contact with a bottom face of a circuit board held by a board holding device above the support table to hold the circuit board from a bottom side thereof, in a direction substantially perpendicular to the surface of the support table, and secured onto the surface of the support table, the pin-erecting guide plate being made of an elastic plate-shaped member, and having: a plurality of pin-erecting through-holes each formed so as to pass through top and bottom faces of the elastic plate-shaped member, for holding the support pin inserted into the through-hole and passing therethrough with an elastic force of the elastic plate-shaped member.

The elastic plate-shaped member may be made of rubber. Herein, plate-shaped surface layer members having a non-shrinking property are bonded to top and bottom faces of the plate-shaped member. The surface layer member has a pin passing-and-inserting hole communicated with the pin-erecting through-hole of the elastic plate-shaped member. Thus, it becomes possible to prolong a durable period of the pin-erecting guide plate. The surface layer member may be made of any one of a plastic, an iron, and an aluminum. The surface layer member can be bonded to the elastic plate-shaped member by bonding or sintering.

The elastic plate-shaped member is a rectangular plate-shaped member formed by mutually connecting to each other connecting portions of a plurality of elastic plate members each formed into a rectangular shape and each having the connecting portion formed on at least one side face sandwiched by top and bottom faces, in such a manner that the respective side faces of the elastic plate members come in contact with each other.

The elastic plate members having the connecting portions are connected to each other so that it is possible to obtain a pin-erecting guide plate having a desired area.

Yet another aspect of the present invention relates to a pin-erecting guide plate for holding at least one support pin in a direction substantially perpendicular to the surface of the support table, the pin-erecting guide plate being formed from a box-shaped member made of a plastic material with one opened face in a pair of opposed faces while being provided in parallel with the surface of the support table, the pin-erecting guide plate comprising a plurality of tubular holder portions each, passing through a surface portion of the other face not opened to extend in the direction substantially perpendicular from the surface portion toward the opened face, for holding the support pin therein. The support pin inserted into the holder portion is brought into contact with the surface of the support table so that the support pin is held in the direction substantially perpendicular to the surface of the support table.

The holder portion includes one of a slit extending along at least a part of the holder portion in a longitudinal direction thereof and a rib extending along at least a part of inside of the holder portion in the longitudinal direction or both the slit and the rib, and the holder portion restricts the support pin from moving in an axial direction thereof and a direction orthogonal to the axial direction to hold the support pin.

Yet another aspect of the present invention relates to a pin-erecting guide plate for holding at least one support pin, having one end brought into contact with a surface of a raising/lowering support table and the other end brought into contact with a bottom face of a circuit board held by a board holding device above the support table to support the circuit board from a bottom side thereof, in a direction substantially perpendicular to the surface of the support table, and secured to the surface of the support table. The pin-erecting guide plate comprises: a pair of box-shaped members made of a plastic material and each having one opened face in a pair of faces provided in parallel with the surface of the support table and facing each other, extending in the direction substantially perpendicular from a surface portion of the other one of the pair of face, not opened, toward the opened face while passing through the surface portion, including a plurality of tubular holder portions each for holding the support pin therein, arranged in such a manner that opened faces face to each other and respective ends on the opened faces side of the holder portions face to each other in one to one correspondence. An elastic member is sandwiched between the pair of box-shaped members and between the ends of holder portions facing each other, wherein the elastic member has a communication holding hole for elastically holding the support pin inserted into the pair of holding portions, facing each other, of the pair of box-shaped members and brought into contact with the surface of the support table.

The pin-erecting guide plate may further comprise a positioning hole having, fitted thereto, a positioning pin erected on the surface of the support table to fixedly position the pin-erecting guide plate onto the support table.

Yet another aspect of the present invention relates to a support pin for supporting a circuit board held by a board holding device from a bottom side thereof, the support pin having a length in a longitudinal direction equal to a distance between a surface of a support table at an upper dead center of the raising/lowering type support table arranged below the circuit board and a bottom face of the circuit board in a held state by the board holding device. The support pin has one end in the longitudinal direction brought into contact with the bottom face of the circuit board and the other end in the longitudinal direction passing through a pin-erecting through-hole formed in a pin-erecting guide plate made of an elastic plate-shaped member and secured onto the surface of the support table to be brought into contact with the surface of the support table, thus being elastically held in a direction substantially perpendicular to the surface of the support table to support the circuit board.

The support pin may be constituted by a rod member made of any one of iron, steel, stainless steel, aluminum, and plastic.

In addition, an insertion amount checking marking line may be provided on a periphery of an end in at least one of the support pin in the longitudinal direction and provided at a position that the length from an end face of the end in the longitudinal direction corresponds to a thickness of the pin-erecting guide plate.

Yet another aspect of the present invention relates to a board supporting mechanism for supporting a circuit board held by a board holding device from a bottom side thereof upon processing the circuit board. The board supporting mechanism comprises: a support pin for being brought into contact with a bottom face of the circuit board to support the circuit board; a support table supporting the support pin so as to be raised and lowered; and a pin-erecting guide plate secured to a surface of the support table, for holding the support pin in a direction substantially perpendicular to the surface of the support table, wherein the pin-erecting guide plate is one of the aforementioned pin-erecting guide plates.

Yet another aspect of the present invention relates to a board supporting mechanism for supporting a circuit board held by a board holding device from a bottom side thereof upon processing the circuit board. The board supporting mechanism comprises: a support pin for being brought into contact with a bottom face of the circuit board to support the circuit board; a support table supporting the support pin so as to be raised and lowered; and a pin-erecting guide plate secured to a surface of the support table, for holding the support pin in a direction substantially perpendicular to the surface of the support table, wherein the support pin is one of the aforementioned support pins.

Yet another aspect of the present invention relates to a component mounting apparatus comprising: a component supplying section for supplying a component; a mounting head for taking out the component and carrying out a mounting process; a transfer robot for transferring the mounting head; and a board holding device for carrying in the circuit board to position the circuit board, so that the component is taken out from the component supplying section by the mounting head and mounted at a mounting position on the circuit board. A board supporting mechanism, for supporting the circuit board held by the board holding device from a bottom side thereof, is one of the aforementioned board supporting mechanisms.

Yet another aspect of the present invention relates to a viscous material applying apparatus comprising: a viscous material supplying section for supplying a viscous material; an applying head section for dispersing the viscous material to apply the viscous material onto a circuit board; a driving section for driving the applying head section; and a board supporting device for carrying in the circuit board to position the circuit board, so that the viscous material is applied to the circuit board by the applying head section. A board supporting mechanism, for supporting the circuit board held by the board supporting device from a bottom side thereof, is one of the aforementioned board supporting mechanisms.

With the board supporting method according to the present invention, the other end of the support pin is directly brought into contact with the surface of the support table, so that the support pin is held in the direction substantially perpendicular to the surface of the support table. Further, the one end of the support pin is brought into contact with the bottom face of the circuit board; thus, the support pin supports the circuit board.

With this configuration, even when the support pin and the pin erecting guide plate are changed together with a new one in accordance with a change in model of the circuit board, a reference of a support height of the support pin corresponds with the surface of the support table. Therefore, it is unnecessary to adjust the parallelism between the plate and the support table. That is, it is unnecessary to adjust the support height of the support pin. Accordingly, it is possible to make a setup for a change in model of the circuit board in a considerably more efficient manner in comparison with the conventional art. As one example of a more specific configuration, the support table is formed to have an even plane (surface) without irregularities and to have high rigidity.

In contrast, according to the conventional art, a step portion protruding from a support pin is brought into contact with a surface of a plate (pin supporting plate) in order to determine a reference of a support height of the support pin. Consequently, it is necessary to finely adjust the parallelism between a reference face and a circuit board after completion of an off-line setup. According to the present invention, it is unnecessary to finely adjust the parallelism.

In the component mounting method and the viscous material applying method according to the present invention, the board supporting method according to the present invention is utilized. Thus, the one end of the support pin is brought into contact with the bottom face of the circuit board, so that the support pin supports the circuit board from the bottom side thereof. Therefore, it is unnecessary to adjust the support height of the support pin. Upon execution of processing such as mount of a component and application of a viscous material, it is possible to make a setup for a change in model of the circuit board in a considerably efficient manner, in comparison with the conventional art.

The pin-erecting guide plate according to the present invention is made of an elastic plate-shaped member, and has a plurality of pin-erecting through-holes each formed so as to pass through between top and bottom faces of the elastic plate-shaped member and each capable of holding the support pin, inserted thereinto and passing therethrough, by an elastic force of the elastic plate-shaped member. Therefore, the one end of the support pin is inserted into the pin-erecting through-hole to be brought into contact with the surface of the support table. Herein, a reference of a support height of the support pin does not correspond with a surface of the plate but corresponds with the surface of the support table. Thus, it is unnecessary to adjust the support height of the support pin. Accordingly, it is possible to make a setup for a change in model of the circuit board in a considerably efficient manner in comparison with the conventional art.

The support pin according to the present invention has a longitudinal length equal to a distance between the surface of the support table at an upper dead center of the raising/lowering type support table and the bottom face of the circuit board held by the board holding device, is held in the direction substantially perpendicular to the surface of the support table, and has one end in the longitudinal direction brought into contact with the bottom face of the circuit board and the other end in the longitudinal direction brought into contact with the surface of the support table, thereby supporting the circuit board. Accordingly, a reference of a support height of the support pin does not correspond with the surface of the plate but corresponds with the surface of the support table. Thus, it is unnecessary to adjust the support height of the support pin. Accordingly, it is possible to make a setup for a change in model of the circuit board in a considerably more efficient manner in comparison with the conventional art.

The board supporting mechanism according to the present invention utilizes the pin-erecting guide plate or the support pin according to the present invention. Therefore, it is unnecessary to adjust the support height of the support pin. Accordingly, it is possible to make a setup for a change in model of the circuit board in a considerably more efficient manner in comparison with the conventional art.

In the component mounting apparatus or the viscous material applying apparatus according to the present invention, a board supporting mechanism utilized in the component mounting apparatus or the viscous material applying apparatus is the board supporting mechanism according to the present invention. Therefore, it is unnecessary to adjust the support height of the support pin. Accordingly, upon execution of processing such as mount of a component and application of a viscous material, it is possible to make a setup for a change in model of the circuit board in a considerably more efficient manner, in comparison with the conventional art.

BRIEF DESCRIPTION OF THE DRAWINGS

These and other aspects and features of the present invention will become clear from the following description taken in conjunction with the preferred embodiments thereof with reference to the accompanying drawings, in which.

DESCRIPTION OF THE PREFERRED EMBODIMENTS

Figure 1:
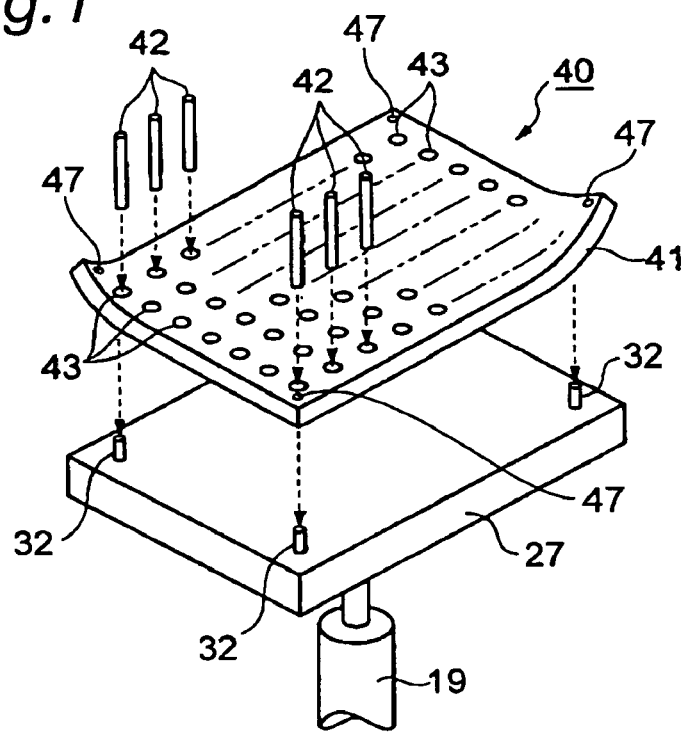
FIG. 1 is a perspective view that illustrates the outline of a board supporting mechanism according to a first embodiment of the present invention.

Before the description of the present invention proceeds, it is to be noted that like parts are designated by like reference numerals throughout the accompanying drawings.

Referring to the drawings, the following description will discuss a board supporting mechanism and a board supporting method according to a first embodiment of the present invention.

Herein, a component mounting apparatus and a component mounting method as examples of a processing apparatus and a processing method capable of using the board supporting mechanism and the board supporting method are described later.

FIG. 1 illustrates a board supporting mechanism 40 according to the first embodiment. In FIG. 1, the board supporting mechanism 40 is constituted by a rectangular-shaped support table 27 that can be raised/lowered between a board supporting position and a board-support releasing position, a rectangular-shaped pin-erecting guide plate (hereinafter, referred to as a guide plate) 41 to be secured onto the support table 27 as indicated by broken line arrows, and support pins 42 to be attached to the guide plate 41 as indicated by broken line arrows in the same manner. The support table 27 is supported by a cylinder 19, and the entire board supporting mechanism 40 is raised/lowered through the support table 27 by driving the cylinder 19. The board supporting mechanism 40 can be raised/lowered between the board supporting position which is positioned above the support table 27 and at which a circuit board 14, not illustrated, can be supported (for example, an upper dead center of the support table 27 upon driving the cylinder 19) and the board-support releasing position at which the support of the board is released below the board supporting position (for example, a lower dead center of the support table 27 upon driving the cylinder 19). A great number of positioning pins 32, used for fixedly positioning the guide plate 41, are erected on the surface (top face) of the support table 27.

The guide plate 41 according to the first embodiment is made of a rectangular plate-shaped elastic body. With respect to the elastic body, a material that is less susceptible to secular changes and superior in heat resistance, oil resistance, and weather resistance is preferably used, and, for example, neoprene rubber, nitrile rubber, or the like may be used. A number of pin-erecting through-holes (hereinafter, referred to as pin holes) 43, which penetrate top and bottom faces and are used for attaching the support pins 42, are penetrated and formed in the guide plate 41. The layout of these pin holes 43 is desirably determined, and, for example, set with intervals of 15 mm in longitudinal and lateral directions.

In this manner, the guide plate 41 is made of an elastic body; thus, when an operator manually pushes the support pin 42 in the pin hole 43, the support pin 42 can be easily secured in a state in which the support plate pin 42 is erected in a direction substantially perpendicular to the top face of the guide plate 41. For example, supposing that the outer diameter of the columnar pillar-shaped support pin 42 is 3 mm in nominal value, the pin hole 43 may be set to a value about 0.1 mm smaller than this value so that the support pin 42 is easily inserted into the pin hole 43 by hand. Concurrently, by use of the elastic force of the guide plate 41 itself, the outer peripheral face of the support pin 42 is elastically press-supported by the inner peripheral face of the pin hole 43 so that the support pin 42 is stabilized, and the support pin 42 is held while being prevented from slipping off from an erect state in the direction substantially perpendicular to the top face of the guide plate 41. Here, the pin hole 43 need not be formed as a straight hole, and this will be described later. In the case where the outer diameter of the support pin 42 is set to 3 mm, by setting the thickness of the guide plate 41 to about 10 mm, the guide plate 41 can hold the support pin 42 substantially perpendicularly in a stable manner even upon mounting a component. The pin hole 43 may be penetrated and formed by using, for example, a water jet process.

Figure 13:
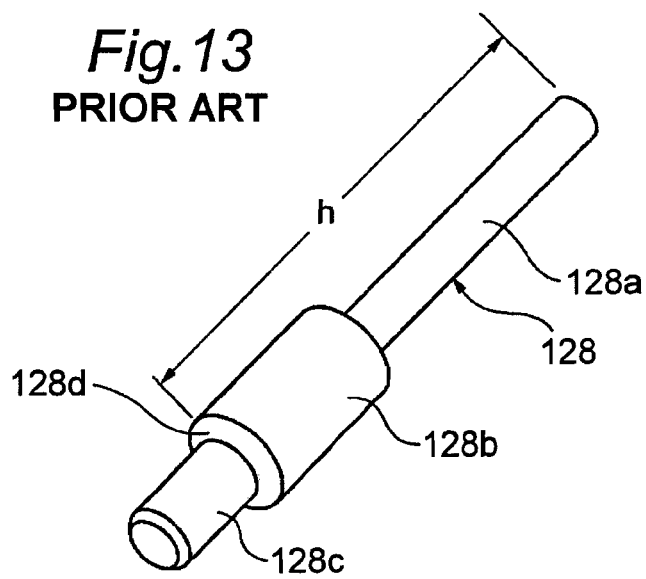
FIG. 13 is a perspective view of a conventional support pin used in the board holding device illustrated in FIG. 12.

The support pin 42 according to the first embodiment may be formed into a straight rod shape as illustrated in FIG. 1. Upon attachment of the support pin 42, the support pin 42 is inserted into the guide plate 41 until the lower end of the support pin 42 comes in contact with the surface of the support table 27. In other words, the height from the surface of the support pin 42 to the upper end of the support pin 42 supporting the circuit board 14 can be adjusted by the height (that is, the entire length from one end to the other end of the support pin 42) from the surface of the support table 27 when the support table 27 has reached the upper dead center position of the support table 27. The support pin 42 according to the first embodiment can be easily formed by cutting a round rod having an appropriate outer diameter, made of a material such as iron, steel, stainless steel, aluminum or plastic, and it is not necessary to form a step portion 128b (see FIG. 13) required for the conventional art.

Figure 2:
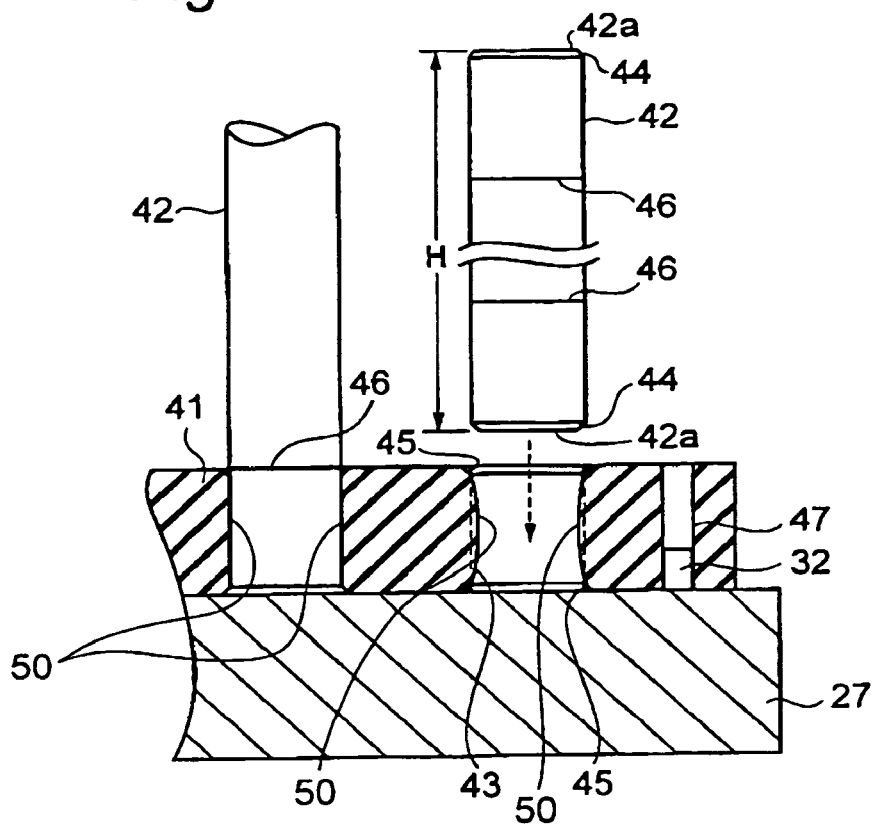
FIG. 2 is a partial side cross-sectional view of the board supporting mechanism illustrated in FIG. 1.

FIG. 2 illustrates a state in which the support pin 42 is inserted into the pin hole 43 of the guide plate 41 in an enlarged manner. In order to facilitate insertion, preferably, chamfered portions 44 are formed on the two end faces 42a of the support pin 42. Also, in order to facilitate insertion, preferably chamfered portions 45 are formed on two edge portions of the pin hole 43. The support pin 42, which has no difference in its top and bottom faces, may be inserted into the pin hole 43 of the guide plate 41 in a desired direction. The guide plate 41, which has also no difference in its top and bottom faces, may be placed with either of the top and bottom faces facing the support table 27. By forming each of the chamfered portions 44 and 45, the operator is allowed to easily insert the support pin 42 into the pin hole 43, and an issue that, when the support pin 42 is inserted into the pin hole 43, the elastic body of the guide plate 41 is stuck between the lower end face 42a of the support pin 42 and the surface of the support table 27 can be avoided, making it possible to eliminate the subsequent occurrence of deviations in the height of the support pin 42.

The inner peripheral face of each of the pin holes 43 may be prepared as a straight hole substantially perpendicular to the surface of the support table 27, as indicated by a broken line in FIG. 2, or may be prepared as a convex shape with a central portion 50 protruded toward a center side, with respect to the shaft center in the center portion 50 of the pin hole 43 in the axial direction as indicated by a solid line in FIG. 2 so that a so-called "tight-fit" effect may be given to the support pin 42. Since the guide plate 41 is made of the elastic body, the insertion of the support pin 42 is easily conducted by the operator by hand even when the center portion 50 of the pin hole 43 in the axial direction is formed into the convex shape protruded toward the center side. By limiting the contact area of the outer peripheral face of the support pin 42 with the inner peripheral face of the pin hole 43 by the tight-fit only to the center portion 50 of the pin hole 43 along the axial direction, it is possible to ensure a sufficient elastic holding force while the easy insertion of the support pin 42 is being maintained.

It is preferable to form an insertion-amount checking index line 46 on the outer peripheral face of each support pin 42 at a position preliminarily including a thickness portion (10 mm in the aforementioned example) of the guide plate 41 from one of or both the end faces of the support pin 42. When the operator inserts the support pin 42 into the pin hole 43 of the guide plate 41, the insertion-amount checking index line 46 serves as a guidepost that allows the operator to know the fact that the tip 42a of the support pin 42 has come into contact with the surface of the support table 27, thereby making it possible to eliminate the occurrence of deviations in the height from the surface of the support table 27 to the tips 42a of the support pins 42, on the side that the circuit board 14 is held, due to a fact that the lower end of the support pin 42 is not brought into contact with the surface of the support table 27 since the support pin 42 is not sufficiently inserted upon insertion of the support pin 42. With respect to the insertion-amount checking index line 46, for example, a method for giving different colors to a portion to be inserted into the guide plate 41 and the other portion may be used.

Here, the support pin 42 is preferably prepared as a round rod having a straight shape because when the support pin 42 is inserted into the pin hole 43 of the guide plate 41, the orientation or insertion direction of the support pin 42 is not limited. However, a rod shape having a polygonal shape in its cross section may be used, if necessary, and the pin hole 43 with the support pin 42 inserted thereinto may be formed as a hole having the corresponding polygonal shape in its cross section. Here, the "straight shape" refers to a shape the cross section orthogonal to the longitudinal direction of which is unchanged at any position; however, the shape is not necessarily limited to the straight shape, and it is sufficient that the portion of the support pin 42 to be inserted into the pin hole 43 is formed to have such a dimension and a size that the support pin 42 elastically held by the pin hole 43 in the direction substantially perpendicular to the surface of the support table 27 is prevented from being inclined from the substantially perpendicular state. In order to allow an operator to perform an insertion operation easily, the center portion of the support pin 42 in the longitudinal direction may be formed into a concave shape or a convex shape. That is, the support pin 42 is not formed in such a manner that the step portion 128b is formed like the support pin 128 in the conventional art and is brought into contact with the surface of the support table 27 so that the support pin 42 is supported by the plate, but is formed in such a manner that the support pin 42 penetrates through the pin hole 43 of the guide plate 41 to be brought into contact with the surface of the support table 27 so that the support pin 42 is elastically held in the direction substantially perpendicular to the surface of the support table 27.

A positioning hole 47, used for receiving the positioning pin 32 erected on the surface at, for example, each corner portion of the support table 27, is formed on the bottom face at, for example, each corner portion of the guide plate 41. In order to fixedly position the guide plate 41 onto the support table 27, it is only necessary to fit the four positioning pins 32 of the support table 27 to the four positioning holes 47 of the guide plate 41. Since the guide plate 41 is made of an elastic body such as rubber, it is possible to obtain a sufficient holding strength by forming the diameter of each positioning hole 47 smaller than the diameter of the positioning pin 32 by, for example, about 0.1 mm and fitting the positioning pin 32 into the positioning hole 47. Of course, another fastening member such as a bolt may be used so as to fixedly position the guide plate 41 to the surface of the support table 27.

The following description will discuss a board supporting operation of the board supporting mechanism 40.

The guide plate 41 is fixedly positioned to the surface of the support table 27 and, then, the support pins 42 are inserted into the pin holes 43 of the guide plate 41 corresponding to positions to be supported by bringing the support pins into contact with the bottom face of the circuit board 14 (see FIG. 10) placed above the support table 27 as will be described later. Thus, the lower end of each of the support pins 42 is brought into contact with the surface (herein, the top face) of the support table 27 and the support pins 42 are held in the direction substantially perpendicular to the surface of the support table 27.

Thereafter, the support table 27 is raised from the lower dead center to the upper dead center by the cylinder 19, and the support pins 42 erected on the surface of the support table 27 and held by the guide plate 41 in the direction substantially perpendicular to the surface of the support table 27 are brought into contact with the bottom face of the circuit board 14 to support the circuit board 14.

When the support of the circuit board 14 is released, the support table 27 is lowered from the upper dead center to the lower dead center by the cylinder 19 so that the support pins 42 are separated from the bottom face of the circuit board 14. After the support table 27 is positioned at the lower dead center, if necessary, the support pins 42 are appropriately inserted into/removed from the guide plate 41 in accordance with a size of the next circuit board 14 to be supported and the layout of the components. Thus, the number of support pins 42 and the size thereof are changed.

Figure 10:
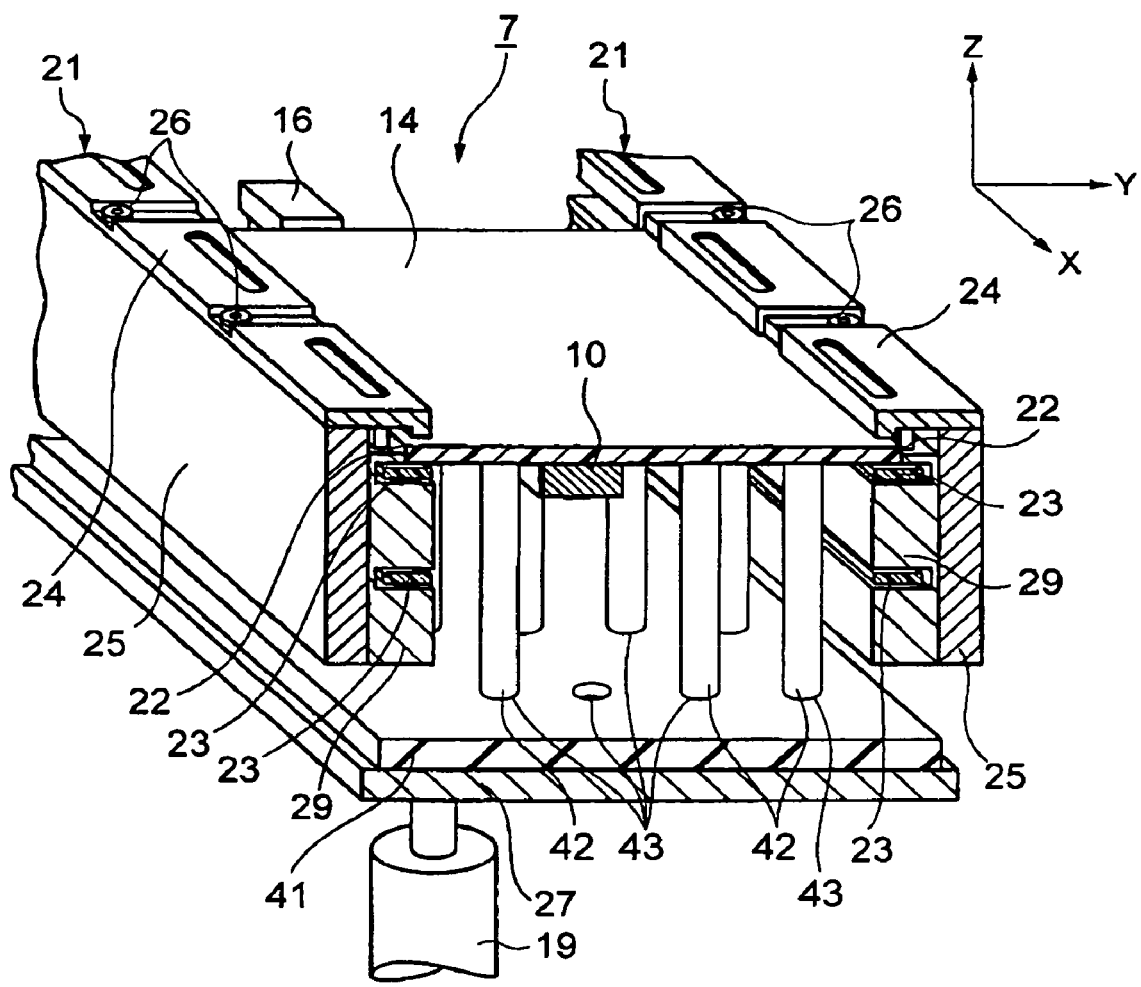
FIG. 10 is a perspective view that illustrates the outline of a board holding device in the component mounting apparatus illustrated in FIG. 9.
Figure 11:
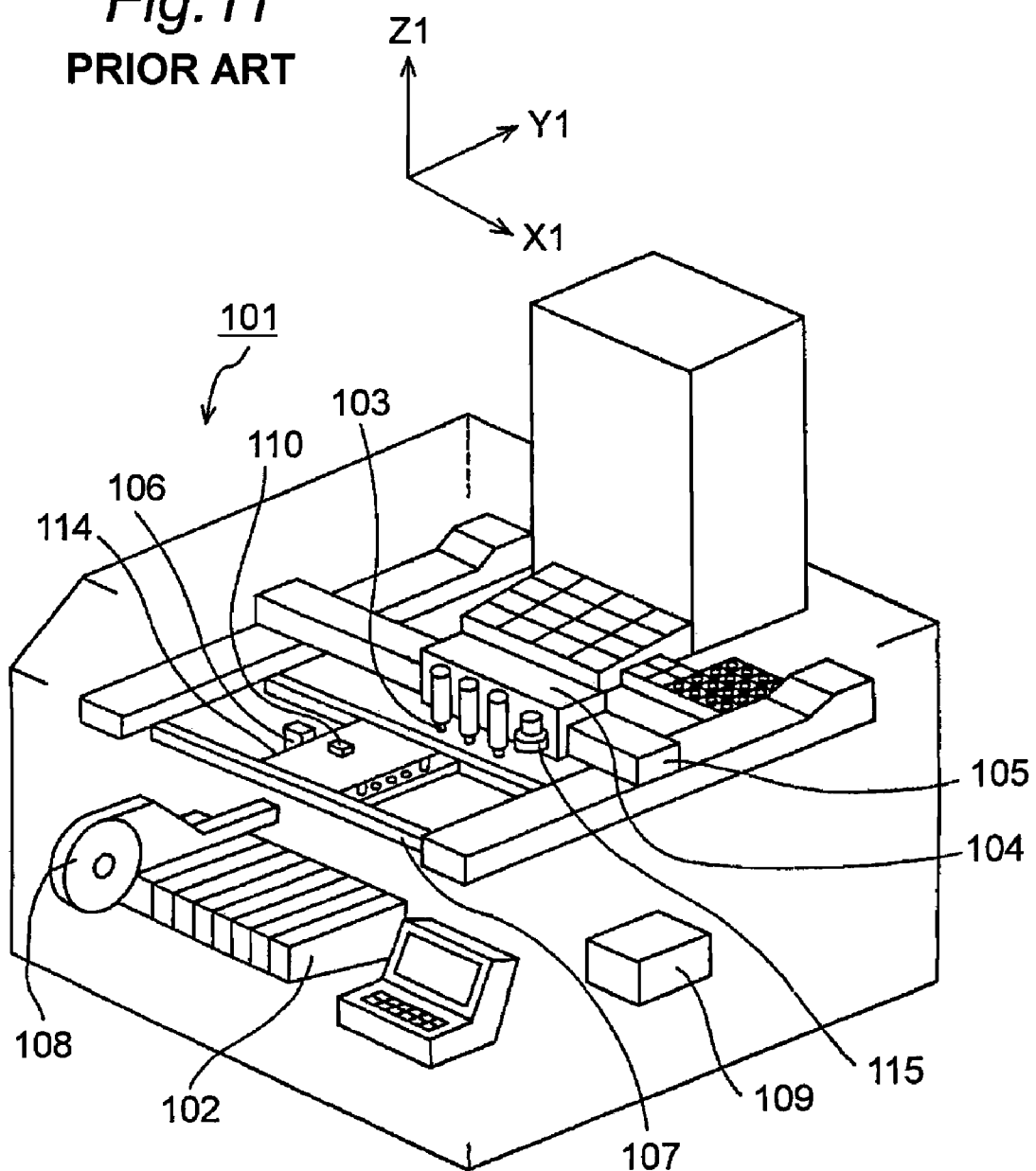
FIG. 11 is a perspective view that illustrates the outline of a conventional component mounting apparatus.

Referring to the drawings, the following description will discuss one example of the processing apparatus and the processing method capable of using the board supporting mechanism and the board supporting method, e.g., the component mounting apparatus and the component mounting method according to the first embodiment of the present invention. As illustrated in FIG. 10, the component mounting apparatus 1 includes a component supplying section 2 for supplying components to be mounted, a mounting head 4 for taking out the component from the component supplying section 2 by utilizing a suction nozzle 3 and mounting the component on a circuit board 14, a transfer robot 5 for transferring the mounting head 4 to a predetermined position, a component recognizing device 6 for picking up an image of the component held by the suction nozzle 3 to recognize a position and/or an angular deviation thereof, a board holding device 7 for carrying in and holding the circuit board 14, and a control section 9 for controlling the entire operations of the component mounting apparatus 1.

When the component mounting apparatus 1 configured as described above is actuated, the mounting head 4, transferred by the transfer robot 5, is moved to a position facing a component supplying device 8 provided on the component supplying section 2, and allowed to take a component out of the component supplying device 8 by utilizing the suction nozzle 3. Then, the suction nozzle 3 is moved to a position facing the component recognizing device 6 by the movement of the mounting head 4 so that the holding state of the component including the position and/or the angular deviation of the component that has been suction-held is recognized by the component recognizing device 6.

In these operations, a circuit board 14 is carried in the component mounting apparatus 1, and position-held at a predetermined mountable position by the board holding device 7 and, also, supported by the board supporting mechanism 40 according to the first embodiment of the present invention. The mounting head 4 with the component being held by the suction nozzle 3 is transferred by the transfer robot 5 and moved to a position facing a top face of the circuit board 14. A board recognizing device 15 attached to the mounting head 4 picks up an image of the circuit board 14 to recognize a position and/or an angular deviation thereof, and transmits the results of recognition to the control section 9. The control section 9 has preliminarily read NC data in which component mounting positions of respective components to be mounted onto the circuit board 14 have been recorded. Based on the state of the component inputted from the component recognizing device 6 and the state of the circuit board 14 inputted from the board recognizing device 15, the control section 9 instructs the mounting head 4 to carry out necessary corrections with respect to the position and/or the angle of the suction nozzle 3.

Based on the instructions, the mounting head 4 corrects the position and/or the angle of the component 10, and mounts the component 10 on the component mounting position on the circuit board 14 by utilizing the suction nozzle 3. After the component 10 has been mounted, the mounting head 4, again transferred by the transfer robot 5, is moved to the position facing the component supplying device 8, and thereafter, the aforementioned operations are repeated. After having finished mounting all the predetermined components, the circuit board 14 is carried out of the component mounting apparatus 1 by the board holding device 7, and the next circuit board 14 is carried in the component mounting apparatus 1 so that the aforementioned operations are repeated.

The following description will discuss the board holding device 7 for holding the circuit board 14 in cooperation with the board supporting mechanism 40.

FIG. 10 illustrates the board holding device 7 for holding the circuit board 14 at the mountable position, and herein, one portion on the front side is exploded. As illustrated in FIG. 10, the circuit board 14 is held by a pair of rail units 21 that are extended in an X direction and made face to face with each other. Grooves 22 are formed in the respective rail units 21 so as to be made face to face with each other, and flat belts 23 are extended to pass along the grooves 22 so as to move therein. In FIG. 10, the flat belt 23 is illustrated as two portions, which are connected to each other at two ends in the X direction, not illustrated, to form an endless belt, and engaged with a driving source such as a motor in a drivable manner. The two sides of the circuit board 14 are fitted in the paired grooves 22. The circuit board is placed on the paired flat belts 23, and can be moved and transferred in the X direction in FIG. 10 by the synchronous driving of the paired flat belts 23.

One of the paired rail units 21 (for example, one on the right side of FIG. 10) is movable in the direction toward and away from the other rail unit 21 (the other one on the left side) (in a Y direction), and by this movement of the one rail unit 21, it becomes possible to adjust the space between the rail units 21 and hold and transfer circuit boards 14 having various width dimensions. A reference rail 24 having an L-letter-shaped cross section is secured to a main rail 25 on the top face of each of the rail units 21 by securing pins 26. The face (bottom face) of the L-letter-shaped reference rail 24 on the side opposing to the circuit board 14 restricts the movement of the circuit board 14 upward, and forms the reference face upward in a Z direction with respect to the circuit board 14 at the time of mounting a component.

The support table 27 is rigid and has a surface formed as an even plane without irregularities. The support table is positioned below the two rail units 21, and the guide plate 41, which is placed on the support table 27, guides and holds the many erected support pins 42 in the Z direction of FIG. 10. As will be described later, the upper end of each support pin 42 is brought into contact with the bottom face of the circuit board 14 so as to support the circuit board 14 from the bottom side thereof against load and vibration acting on the circuit board 14 at the time of mounting a component to thereby alleviate the load and/or the vibration.

The board holding device 7 having the aforementioned structure is operated in the following manner.

First, when a circuit board 14 is carried into the component mounting apparatus 1 by a loader (not illustrated) the endless paired flat belts 23 of the board holding device 7, which rotates in synchronization with the carry-in operation of the loader, carry the circuit board 14 and transfer the circuit board 14 to a mountable position. At a movement restricting position adjacent to the mountable position, a drawing-type stopper 16 protrudes in a manner so as to block the progressing path of the circuit board 14. When the transferred circuit board 14 comes into contact with the stopper 16, the circuit board 14 is positioned at the mountable position, and the paired flat belts 23 are also stopped simultaneously.

Next, the cylinder 19, which supports the support table 27 beneath the support table 27 so as to be freely raised and lowered, extends to raise the support table 27, and thereby, the circuit board 14 is raised upward together with the holding rails 29 housing the flat belts 23. With this arrangement, the top face of the circuit board 14 is moved into close-contact with the reference faces forming the bottom faces of the reference rails 24 so that the circuit board 14 is positioned in the Z direction. Simultaneously, the number of support pins 42 attached to the guide plate 41 come into contact with the bottom face of the circuit board 14 to support the circuit board 14 from the bottom side thereof so that the circuit board 14 is supported between the reference rails 24 and the support pins 42 so as to endure load and vibration applied at the time of mounting the components 10.

With respect to the operation of the board supporting device 7 after the components 10 have been mounted, in a manner reversed to the aforementioned operation, the cylinder 19 shrinks and the support table 27 is consequently lowered so that the upward pressing force on the circuit board 14 by the paired flat belts 23 is released, and the supporting force applied to the circuit board 14 by the support pins 42 from the bottom side thereof is simultaneously released.

Next, the paired flat belts 23 are again driven in synchronization with each other so that the circuit board 14 is further moved rearward in FIG. 10, and carried by an unloader (not illustrated) which is synchronously driven, and transferred out of the component mounting apparatus 1. Simultaneously, the next circuit board 14 is carried on the paired flat belts 23 by the loader and transferred into the mountable position. Upon transferring the circuit board 14 out, the stopper 16 is retracted below the circuit board 14 to allow the circuit board 14 to move, and after the carrying-out process of the circuit board 14, the stopper 16 is again positioned to face the next circuit board 14 so as to protrude toward the movement restricting position.

The number of support pins 42 to be attached to the guide plate 41 is selected depending on various dimensions such as a plate thickness and an area of the circuit board 14 to be supported. In the case of a circuit board 14 having a large plate thickness with a high degree of rigidity, the support pins 42 could be omitted in some cases. In contrast, in the case of a circuit board 14 having a small plate thickness with a wide width, the number of support pins 42 could be placed, for example, at a pitch of 10 to 15 mm.

Moreover, in the case where, as illustrated in FIG. 10, a component 10, which has been already mounted on the bottom face of the circuit board 14, is present, the support pin 42 is not attached to a corresponding position of the guide plate 41 (indicated by a vacant pin hole 43), on which the component 10 is present, so as to avoid interference of the mounted component 10 with the support pin 42. Therefore, in response to the size of the circuit board 14 and the component mounting state of the bottom face, each time the model changes in the circuit board 14 to be produced, a setup for changing the layout of the support pins 42 on the guide plate 41, that is, work for attaching/detaching the support pins 42 is required.

The support table 27 is secured to the component mounting apparatus 1 through the cylinder 19, and the surface (top face) of the support table 27 facing the circuit board 14 is adjusted so as to be in parallel with the bottom faces of the reference rails 24 that position-restrict the circuit board 14 from above the circuit board 14. The surface (top face) of the guide plate 41 to be placed on the support table 27 is also secured so as to be in parallel with the bottom faces of the pair of reference rails 24 in the same manner so that this structure allows the respective support pins 42, supported by the guide plate 41, to support the bottom face of the circuit board 14 from the bottom side thereof with even loads.

According to the first embodiment, since the board supporting mechanism 40 is designed as described above, the following remarkable advantages are obtained in comparison with the conventional art.

(1) Adjustment for parallelism between the guide plate 41 and the support table 27 is unnecessary.

Figure 12:
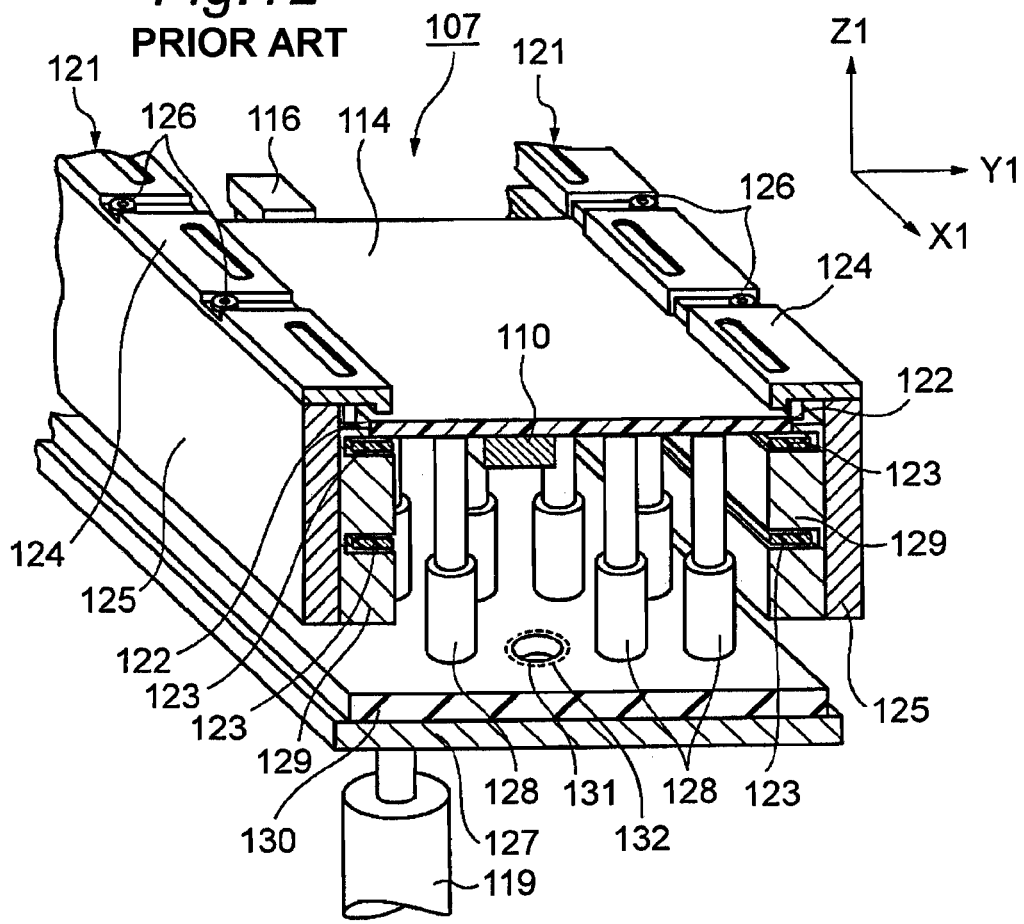
FIG. 12 is a perspective view that illustrates the outline of a board holding device in the component mounting apparatus illustrated in FIG. 11.

According to the conventional art, since the surface of the pin supporting plate 130 (see FIG. 12) forms the reference face of the support height "h" of the support pin 128, it is necessary to strictly control (adjust) the parallelism between the pin supporting plate 130 and the support table 127. For example, since the support table 127 and the pin supporting table 130 are secured while being held in close-contact with each other, it was necessary to strictly control the surface precision of the pin supporting plate 130 in order to eliminate variations in the thickness of the pin supporting plate 130 itself.

In contrast, in the first embodiment, since the surface of the support table 27, with which one end of each support pin 42 is directly brought into contact, forms the reference face of the support height "H" of the support table 27, it is only necessary for the guide plate 41 to simply elastic-hold one end of each support pin 42. Therefore, it is only necessary to maintain a thickness capable of elastically holding the support pin 42, and the parallelism between the support table 27 and the guide plate 41 does not matter so much. It is to be noted that the parallelism between the support table 27 and the circuit board 14 is ensured by the board holding device 7.

(2) It is unnecessary to provide the step portion in the support pin 42.

In the first embodiment, since the reference face of the support height "H" (see FIG. 2) forms the surface of the support table 27, the step portion (indicated by reference numeral 128b in the conventional art) of the support pin 42, required for ensuring the precision of the support height "H", becomes unnecessary. Therefore, it is possible to form a light-weight, small-size and inexpensive support pin 42. More specifically, a commercially available round rod can be used as the support pin 42.

(3) The attaching process of the guide plate 41 to the surface of the support table 27 becomes easier.

As described above, by fitting the positioning pins 32 of the support table 27 to the positioning holes 47 of the guide plate 41, respectively, and placing the guide plate 41 on the surface of the support table 27, the guide plate 41 is firmly secured to the surface of the support table 27 by the elastic force of the guide plate 41.

(4) The support pin 42 is easily attached to the guide plate 41.

It is only necessary for the operator to insert the support pin 42 into the pin hole 43 of the guide plate 41. The similar inserting system has been used also in the conventional art; however, different from the case in which the support pin 128 made of metal (stainless steel) is inserted into the pin inserting hole 131 of the pin supporting plate 130 made of metal (aluminum) in the conventional art, the guide plate 41 is made of an elastic body in the first embodiment so that the workability for inserting the supporting pin 42 is improved greatly. This superior effect is obtained in the same manner even in comparison with the conventional art structure (Patent Document 1) in which a notch is formed on the support pin made of metal so as to provide an elastic force.

(5) Setup is easily carried out.

In connection with the aforementioned item (4) also, first, since the insertion of the support pin 42 into the pin hole 43 of the guide plate 41 is free from upward and downward directivities, and since each pin is lighter than a conventional one because of the elimination of a step portion, the position-change is easily carried out even when the positions of a number of support pins 42 need to be changed. Next, with respect to the aforementioned off-line setup that is carried out with the guide plate 41 being taken out of the board holding device 7, since the guide plate 41 is made of an elastic body such as rubber and is lighter than the conventional one, the carrying-in and out processes to and from the board holding device 7 are easily conducted (the guide plate 41 is, for example, about 2 kg in a normal size, and the weight can be reduced to only a fraction of the weight of the conventional aluminum product). Moreover, since the surface of the guide plate 41 is not used as the reference of the support height "H", it is not necessary to adjust the parallelism between the support table 27 and the guide plate 41, upon attaching the guide plate 41 to the support table 27.

(6) The holding of the support pin 42 of the guide plate 41 is more secure in comparison with the conventional art.

Since the support pins 42 are held by the guide plate 41 made of an elastic body, it is possible to elastically absorb impacts and vibrations to a certain degree. Moreover, upon insertion of the support pin 42, even if the support pin 42 is forcibly inserted into the surface of the guide plate 41 in a slanted state, the guide plate 41 can elastically absorb impacts and vibrations. Accordingly, abrasion, permanent set in fatigue, and the like, which are caused by forcibly inserting the support pin 128 into the pin inserting hole 131 of the pin supporting plate 130 made of metal in the conventional art, do not occur, making it possible for the guide plate 41 to stably hold the support pin 42.

According to the first embodiment, as described above, it is possible to efficiently conduct a support pin position changing operation for a board supporting mechanism upon changing a model of a circuit board and, also, to eliminate complications in the attachment/detachment of a plate that have been a burden in the conventional art for supporting a support pin and adjustment of parallelism between the plate and a support table. Thus, it is possible to greatly reduce the workload on an operator upon a setup process accompanying model changes in the circuit board and, also, to reduce the time required for a setup and to improve equipment operability.

Moreover, it is possible to decrease the entire weight of a board holding device moved by a robot, to facilitate positional control by the decrease of inertia, and to lead to a reduction in driving energy.

In the board supporting mechanism 40 according to the first embodiment, since an elastic body is used as the guide plate 41, there is a possibility that the elastic body will shrink due to a secular change. In the case where the guide plate 41 is shrunk, it becomes difficult to attach the guide plate 41 to the support table 27, or the pitches of the respective support pins 42 slightly change, with the result that the tip of each support pin 42 might interfere with a mounted component 10 of the circuit board 14. In accordance with tests conducted by the present inventors, when the guide plate 41 is formed by using nitrile rubber, a period of use of about two years is expected under a normal use environment. In this case, however, since the elastic body such as rubber used for the guide plate 41 is inexpensive, the use of the guide plate 41 cuts costs greatly in comparison with the conventional art, even when exchanged in two years.

Figure 3:
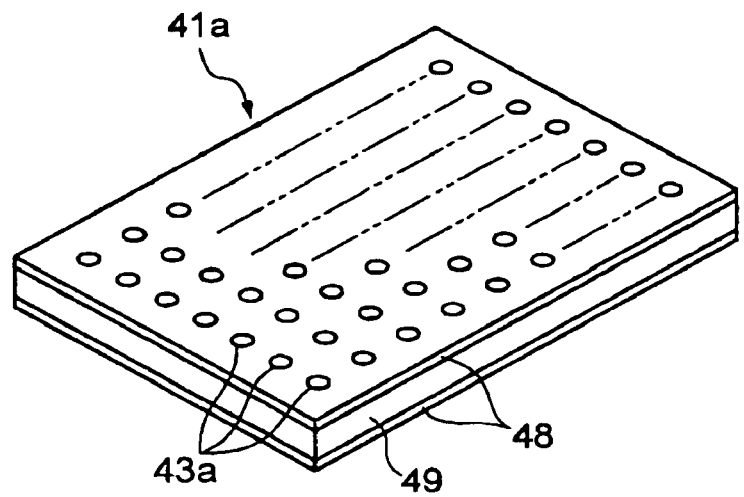
FIG. 3 is a perspective view illustrating another mode of a pin-erecting guide plate used in the board supporting mechanism illustrated in FIG. 1.

FIG. 3 illustrates a guide plate 41a according to another mode of the first embodiment. The guide plate 41a, which has been devised to reduce the aforementioned shrinkage caused by secular changes, is constituted by a pair of surface layer members 48 constituted by plate members having a non-shrinking property, and a holding layer member 49 made of an elastic body as one example of an elastic plate-shaped member, which is sandwiched by the pair of surface layer members 48. Examples of the plate members having a non-shrinking property which are used as the surface layer members 48 may include members less in linear expansion and thermal expansion than the holding layer member 49, for example, plastic plates, iron plates, and aluminum plates. The holding layer member 49 is provided with pin inserting through holes 43 (not illustrated). Pin passing-and-inserting holes 43a are formed on the surface layer members 48 in association with the holding layer member 49, and since the holding of the support pins 42 is carried out by the holding layer member 49 made of the elastic body, the pin passing-and-inserting holes 43a of the surface layer members 48 may be formed to have a size of the pin holes 43. Further, chamfered portions 45 may be formed as in the pin passing-and-inserting hole 43 illustrated in FIG. 2.

The surface layer members 48 and the holding layer member 49 are firmly joined to each other through a physical and/or chemical process, such as bonding or rubber printing. Even when the surface layer members 48 are placed to form a guide plate, it is possible to achieve a great reduction in weight in comparison with the conventional pin supporting plate 130 made of a single metal plate.

By joining the surface layer members 48 and the holding layer member 49, the shrinkage of the holding layer member 49 of the elastic body caused by secular changes is suppressed by utilizing the strength of the surface layer members 48 so that the durable period can be improved. For example, with respect to the guide plate 41 made of only an elastic body, an expected amount of shrinkage after two years is about several millimeters in the case of the length of, for example, 800 mm in the longitudinal direction. Even such shrinkage makes it difficult to fit the positioning pins 32 of the support table 27 to the positioning holes 47 of the guide plate 41. However, the function of the elastic body for holding the support pins 42 is still exerted sufficiently even in a stage having such shrinkage. Therefore, when the shrinkage of the guide plate 41a is suppressed by additionally placing the surface layer members 48, it becomes possible to prolong the durable period of the guide plate 41a. It is to be noted that since the reference of the support height "H" of the support pin 42 in the first embodiment is set on the surface of the support table 27 as described above, it is not necessary to control the thicknesses of the surface layer member 48 and the holding layer member 49.

Figure 4:
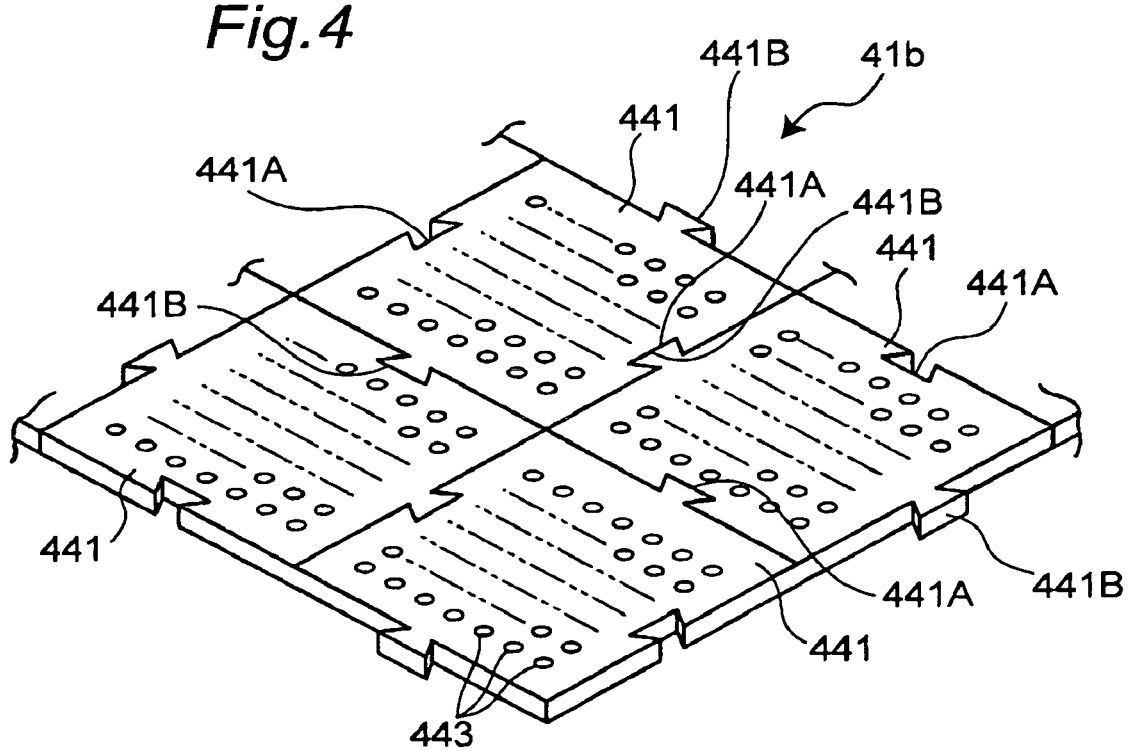
FIG. 4 is a perspective view illustrating still another mode of the pin-erecting guide plate used in the board supporting mechanism illustrated in FIG. 1.

FIG. 4 illustrates a guide plate 41b according to still another mode of the first embodiment. In FIG. 4, the guide plate 41b according to the first embodiment is constituted by a plurality of elastic plate members 441 each formed into a rectangular shape. In each elastic plate member 441, concave portions 441A or convex portions 441B each formed into a dovetail groove are formed as one example of connecting portions on a pair of side faces facing each other while being sandwiched between top and bottom faces. The concave portion 441A and the convex portion 441B are formed so as to be meshed with each other without any gap in such a manner that the concave portion 441A and the convex portion 441B are connectable to or disconnectable from each other only in the thickness direction of the elastic plate member 441 and cannot be disconnected from each other in the direction orthogonal to the thickness direction. The guide plate 41b is formed by the plurality of elastic plate members 441 in which the respective concave portions 441A and the respective convex portions 441B are connected to each other so as to be meshed with each other without the formation of a gap. Thus, by mutually connecting the plurality of elastic plate members 441 to each another, a guide plate having a wider area than the conventional one can be formed. The insertion of the support pin 42 into the pin hole 43 is carried out in the same manner as the aforementioned embodiments.

In the conventional art, upon setup of the support pin 128, the entire pin supporting plate 130 needs to be changed in accordance with the size of a circuit board 114 to be produced. Accordingly, in the case where the pin supporting plate 130 is a heavy member made of metal as in the conventional art, considerable labor has been required upon changing the pin supporting plates 130. In accordance with the guide plate 41b, a guide plate having a different size can be easily formed by combining the required number of the elastic plate members 441 with one another according to the size of the circuit board 14. Since the elastic plate member 441 is made of an elastic body, mutual connections of the members are easily carried out. By preliminarily placing positioning pins 32 corresponding to each corner portion of the guide plate 41b formed into a single member by connecting the plurality of elastic plate members 441 to one another on the support table 27, not illustrated, the guide plate 41b can be easily and fixedly positioned to the support table 27.

Moreover, upon changing the models of the circuit board 14, in the case where the alternation of the layout of the support pins 42 is limited to only one section (that is, a region corresponding to one elastic plate member 441) and the layout of the other area is commonly maintained, only the elastic plate member 441 corresponding to the aforementioned section may be changed by a plate outside-prepared preliminarily so that the setup is conducted very efficiently.

Figure 5:
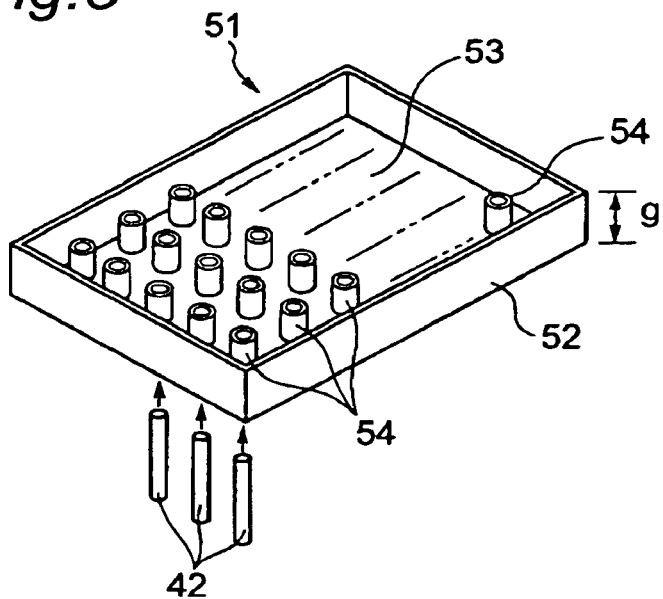
FIG. 5 is a perspective view that illustrates the outline of a board supporting mechanism according to another embodiment of the present invention.

Referring to the drawings, the following description will discuss a board supporting mechanism according to a second embodiment of the present invention. FIG. 5 illustrates a guide plate 51 and support pins 42 to be used in the board supporting mechanism according to the second embodiment. In FIG. 5, the support table 27 is omitted. Moreover, FIG. 5 is viewed from the bottom side (from the side to be secured to the support table 27) with the guide plate 51 being turned upside down; therefore, the support pin 42 is illustrated in a manner so as to be inserted from the back side of FIG. 5, as is illustrated in FIG. 5.

In FIG. 5, the guide plate 51 to be used in the second embodiment is formed by a plastic material with a box shape with one side being open, and is constituted by a peripheral portion 52 having a plate shape surrounding the periphery with a fixed height (thickness), a plane portion 53 forming a surface facing the circuit board 14 and a plurality of tube-shaped holder portions 54 capable of holding the support pins 42. In FIG. 5, only one portion of the holder portions 54 is illustrated, with the other portion being omitted.

The respective thicknesses of the peripheral portion 52 made of a plastic material; the plane portion 53 and the holder portions 54 are designed so as to ensure the respectively required strengths. The height (thickness) "g" of the peripheral portion 52 is preferably designed to have a sufficient height for holding the support pins 42 in the direction substantially perpendicular, and the height "g" of the peripheral portion 52 may be set to about 10 mm with respect to the support pins 42, each having a diameter of 3 mm. With respect to the material for the plastic material, for example, polycarbonate, which has sufficient strength for holding the support pin 42, and is superior in heat resistance, oil resistance, and weather resistance, may be used. Although not illustrated in FIG. 5, ribs may be added to various portions so as to reinforce the guide plate 51, if necessary, from the viewpoint of strength.

As shown in FIG. 5, each support pin 42 is inserted into the holder portion 54, as indicated by an arrow. Since the holder portion 54 is opened in a hollow tube state, the support pin 42 inserted into the holder portion 54 passes through the holder portion 54 and is allowed to protrude therefrom (upper side in FIG. 5). Therefore, in a state in which the guide plate 51 is fixedly positioned onto the surface of the support table 27, the tip of the support pin 42 on the insertion side into the holder portion 54 of the guide plate 51 is brought into contact with the surface of the support table 27 so that the contacted portion forms the reference of the support height "H" by the support pin 42. The same support pin 42 as that illustrated in the first embodiment may be used.

Figure 6A:
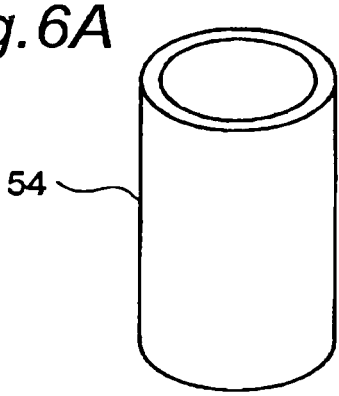
FIG. 6A is a partial enlarged perspective view that illustrates a holder portion of the board supporting mechanism illustrated in FIG. 5.
Figure 6B:
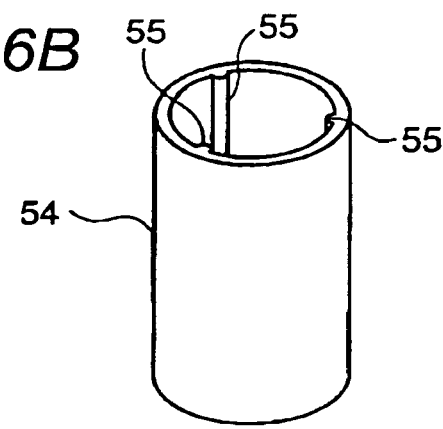
FIG. 6B is a partial enlarged perspective view that illustrates another holder portion of the board supporting mechanism illustrated in FIG. 5.
Figure 6C:
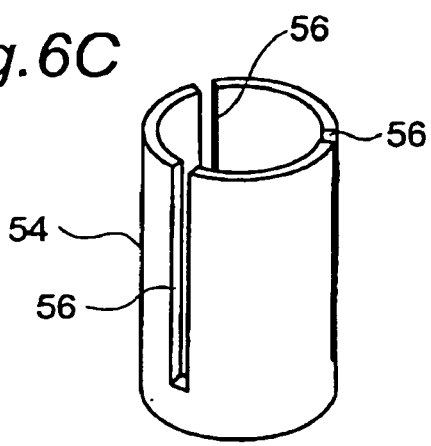
FIG. 6C is a partial enlarged perspective view that illustrates still another holder portion of the board supporting mechanism illustrated in FIG. 5.
Figure 6D:
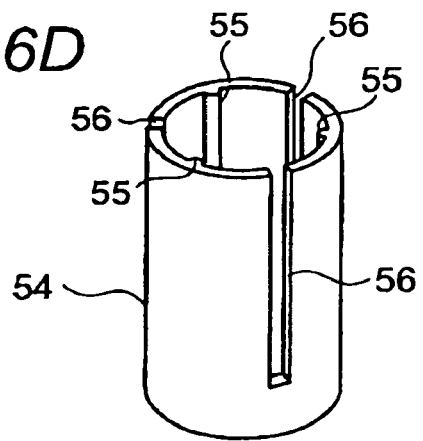
FIG. 6D is a partial enlarged perspective view that illustrates yet another holder portion of the board supporting mechanism illustrated in FIG. 5.

FIGS. 6A to 6D illustrate respective modes of the holder portion 54. In other words, as illustrated in FIG. 6A, the holder portion 54 may have a structure in which a straight tube-shaped hollow section is formed; however, since the holder portion 54 is made of plastics, different from the elastic rubber material, the insertion of the support pin 42 might become too tight, depending on the composition of the plastics. In contrast, when the inner diameter of the holder portion 54 is largely set so as to avoid this issue, there is a possibility that the support pin 42 will accidentally move in the axial direction and in a direction orthogonal to the axial direction. In the example of FIG. 6B, therefore, a plurality (three in the example illustrated in FIG. 6B) of ribs 55 are placed along the inner peripheral face of the holder portion 54 in the axial direction so that the contact area with the support pin 42 is reduced to make the insertion of the support pin 42 easier and, also, to restrict the support pin 42 from accidentally moving in the axial direction and in the direction orthogonal to the axial direction so as to be prevented from slipping-off. Moreover, in the example of FIG. 6C, a plurality (three in the example illustrated in FIG. 6C) of slits 56 are formed so as to extend in the axial direction of the holder portion 54, thereby providing an elastic property to the periphery of the holder portion 54. Furthermore, in the example of FIG. 6D, both of these ribs 55 and slits 56 are formed. In the order from FIG. 6A to FIG. 6D, the holder portion 54, which is allowed to utilize the elasticity of the plastic more effectively, is obtained.

Although not illustrated in FIG. 5, positioning holes 47 (see FIG. 2), formed in the same manner as the holder portions 54, are placed at predetermined positions, and by fitting each of positioning pins 32 of the support table 27 to the corresponding positioning hole 47, the guide plate 51 can be easily and fixedly positioned onto the surface of the support table 27.

The guide plate 51 illustrated in FIG. 5 can achieve further weight reduction as compared with the guide plate 41 in the first embodiment. Advantages of the second embodiment in comparison with the conventional art are basically similar to advantages of the first embodiment. In addition, since each of the outer peripheral portion 52, the planar portion 53 and the holder portion 54 is made of plastic, each of the outer peripheral portion 52, the planar portion 53 and the holder portion 54 is less in secular change than those each made of an elastic body such as rubber; thus, this offers the further advantage of excellent durability.

As described above, FIG. 5 depicts the guide plate 51 in an upside down orientation. The guide plate 51 may be used in the state illustrated in FIG. 5, that is, the plate 51 is secured onto the surface of the support table with its open face directed upward and the support pins 42 are inserted from above in FIG. 5.

Referring to the drawings, the following description will discuss a board supporting mechanism according to a third embodiment of the present invention. In the board supporting mechanism according to the third embodiment, an attempt is made to add advantages of an elastic body to a guide plate made of a plastic material, and consequently to improve the holding force of the support pins 42.

Figure 7A:
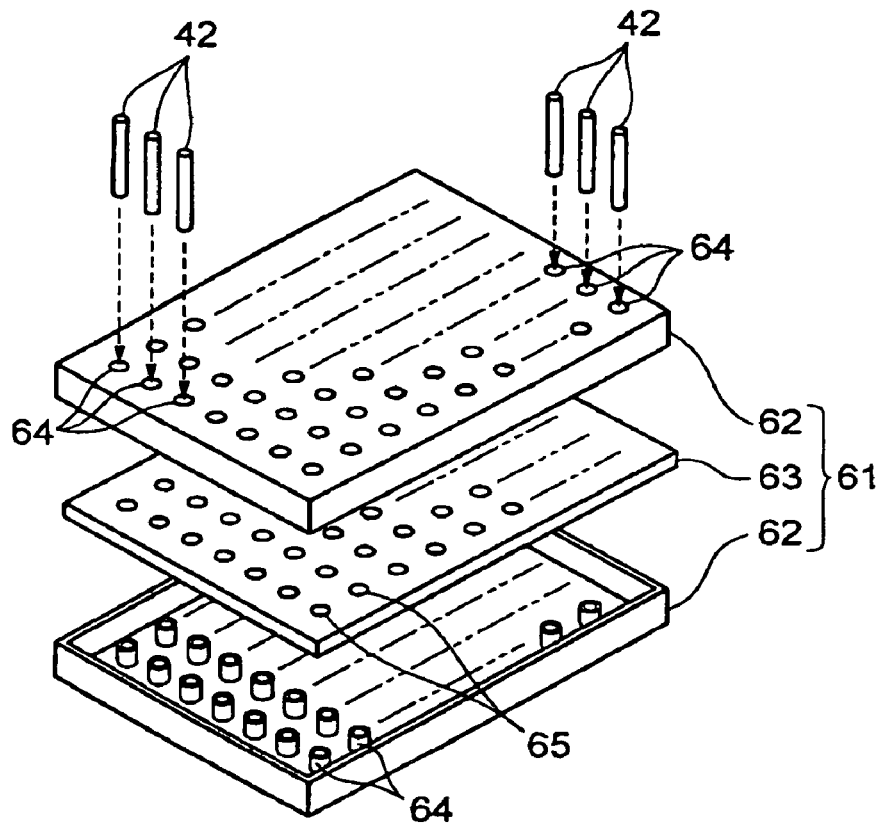
FIG. 7A is a perspective view that illustrates the outline of a board supporting mechanism according to still another embodiment of the present invention.

In FIG. 7A, which illustrates one mode of the third embodiment, a guide plate 61 is provided with a pair of half plates 62 as one example of a pair of box-shaped members and an elastic body plate 63 as one example of an elastic member sandwiched between the two half plates 62. A support table 27 for securing the guide plate 61 from the bottom side thereof is not illustrated in FIG. 7A. The height of each half plate 62 in a direction substantially perpendicular to a surface of the support table 27 may be prepared as, for example, the guide plate 51, described in the second embodiment, whose height (thickness) "g" (see FIG. 5) is made lower. The half plates 62 are made equal in height to each other and preferably made of a single member because the half plates 62 are easily treated in assembly or the like in comparison with half plates made of different members. However, the half plates may be different in height from each other.

Figure 7B:
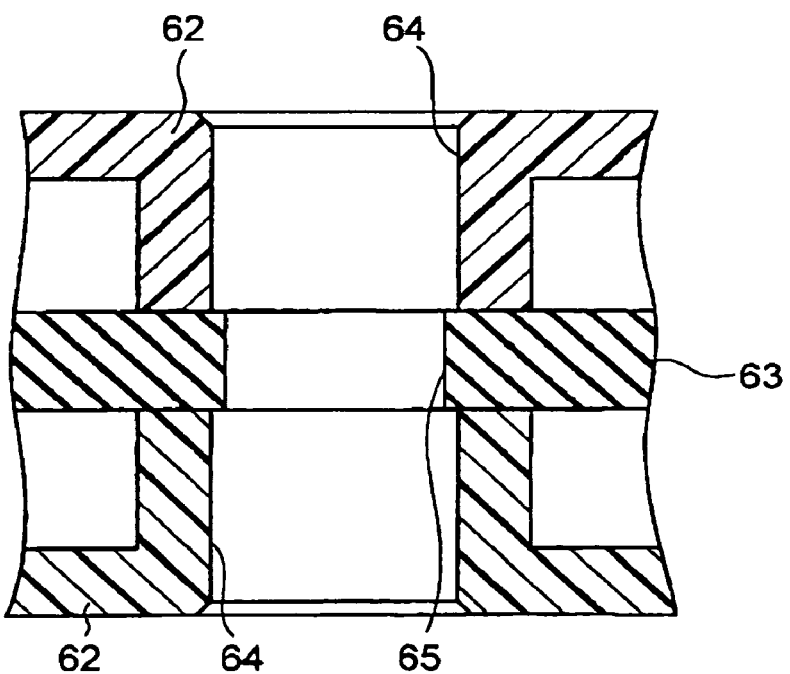
FIG. 7B is a partial side cross-sectional view of the board supporting mechanism illustrated in FIG. 7A.

A number of communication holding holes 65, which hold support pins 42 in association with the holder portion 64 formed on each of the half plates 62, are formed on the elastic body plate 63. FIG. 7B illustrates an enlarged cross section of the holder portion 64 of an assembled guide plate 61. Here, the inner diameter of the communication holding hole 65 of the elastic body plate 63 is made smaller than the inner diameter of the holder portion 64 so that the elastic force of the decreased portion is utilized so as to hold the support pins 42. When the elastic body plate 63 is sandwiched and secured between the pair of half plates 62, each support pin 42, inserted into the guide plate 61 as indicated by broken line arrows illustrated in FIG. 7A, can be firmly and elastically held by the elastic body plate 63, and the fitting of the support pin 42 to the holder portion 64 is made softer so that the insertion of the support pin 42 is easily carried out. Therefore, with respect to the holder portion 64, ribs 55 and/or slits 56 of the holder portion 54 described in the second embodiment may not be formed, and the interior of the holder portion 64 can be shaped into a straight hollow hole. The effects that the reference of the support height "H" of the support pin 42 is set on the surface of the support table 27 and that no directivity on the front and rear sides of the guide plate 61 is required can be obtained in the same manner as the aforementioned embodiments.

The assembling work of the paired half plates 62 and the elastic body plate 63 can be easily carried out by preliminarily inserting a plurality of support pins 42 to a plurality of holder portions 64 so as to use the support pins 42 in place of the positioning pins.

Figure 8:
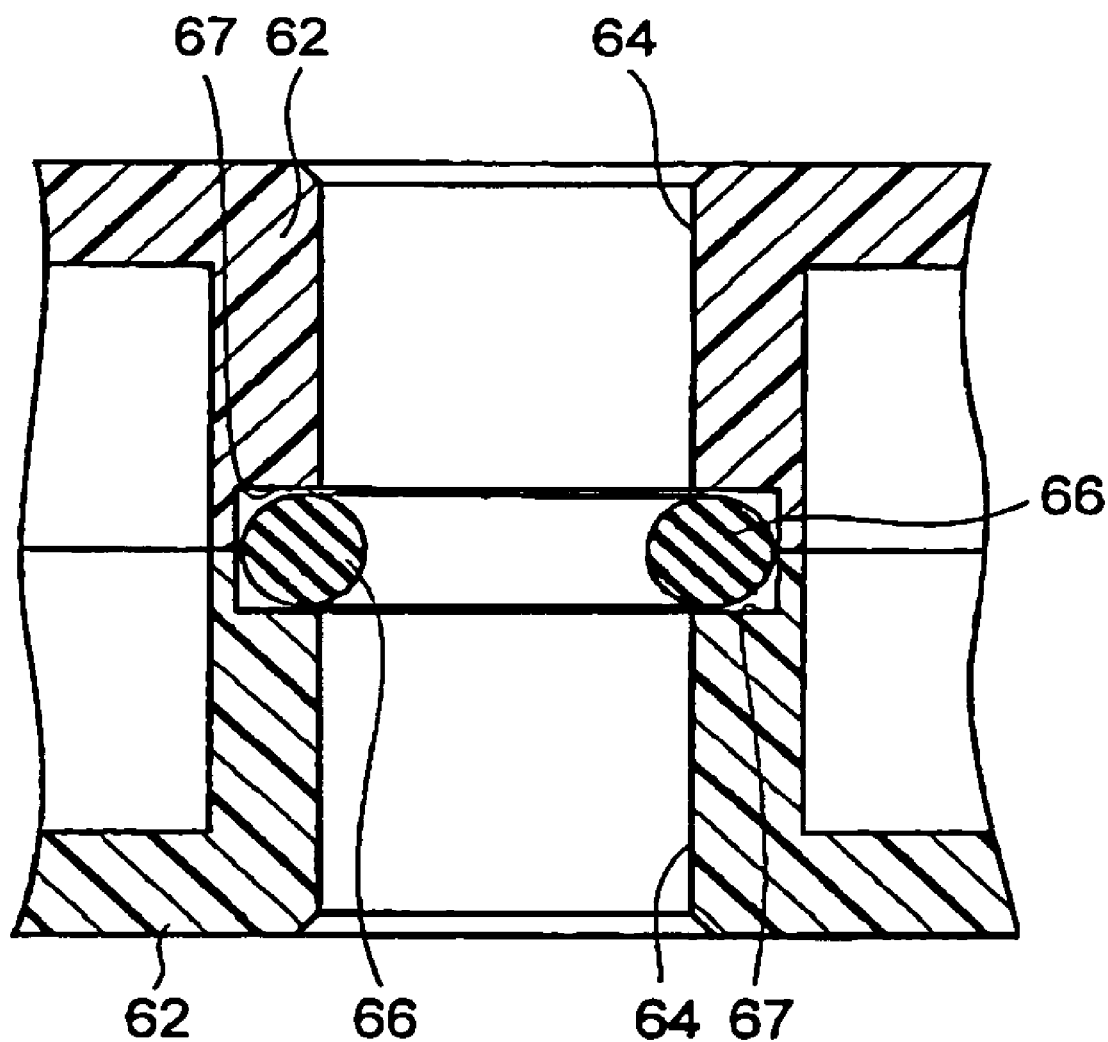
FIG. 8 is a partial side cross-sectional view that illustrates another mode of a holder portion used in the board supporting mechanism illustrated in FIG. 7.
Figure 9:
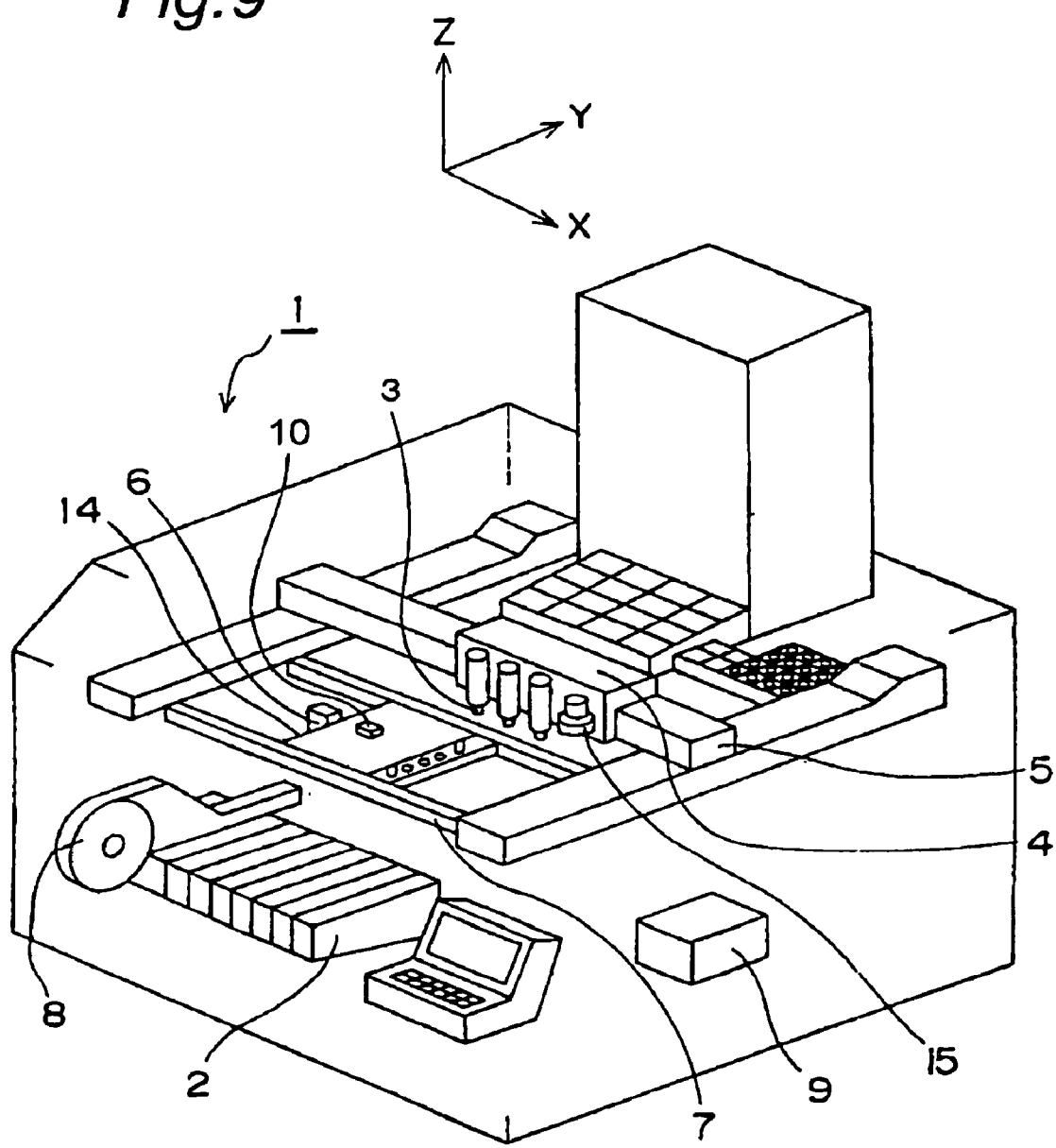
FIG. 9 is a perspective view that illustrates the outline of a component mounting apparatus provided with the board supporting mechanism according to the aforementioned embodiment of the present invention.

FIG. 8, which illustrates another mode according to the third embodiment, corresponds to FIG. 7B and is a cross-sectional side view that illustrates a state in which the paired half plates 62 are superposed one on the other with the holder portions 64 of the paired half plates 62 thereby being positioned face to face with each other. Herein, in place of the elastic body plate 63 to be sandwiched between the half plates 62, a holder ring 66 made of an elastic body as one example of an elastic member is placed in each of the holder portions 64.

In FIG. 8, step portions 67 are formed on the tips of the respective holders 64 on the sides facing each other, and each of the holder rings 66 is fitted to each of the grooves formed by the two step portions 67. When the pair of half plates 62 are fastened to each other by using a fastening member such as a bolt, or combined with each other through bonding or the like, each holder ring 66 is secured in the groove formed by the two step portions 67 inside the holder portion 64.

By designing the guide plate 61 to have the aforementioned structure, the fitting of the support pin 42 to the holder portion 64 can be made comparatively softer so that the insertion of the support pin 42 into the guide plate 61 is easily carried out, with the support pin 42 being firmly and elastically held by utilizing the elastic force of the holder ring 66. In comparison with the aforementioned mode using the elastic body plate 63, it becomes possible to avoid influences due to shrinkage of the elastic body, and also to reduce the weight. With respect to the holder portion 64, ribs 55, slits 56, and the like are no longer required, and the holder portion 64 can be shaped into a straight hollow hole; and thus the same effects as the aforementioned modes can be obtained.

With respect to the holder ring 66, by appropriately selecting the dimensional data of the support pins 42, a commercially available O-ring made of rubber may be utilized efficiently. Moreover, the holder ring 66 is made of an elastic body and, therefore, can be inserted into the holder portion 64 to be placed in the groove formed by the two step portions 67, after the two half plates 62 have been assembled. Accordingly, the assembled two half plates 62 are not required to be disassembled in order to attach the holder ring 66.

Although not illustrated in FIGS. 7A, 7B and 8, positioning holes 47 used for securing the positioning pins 32 of the support table 27 may be formed on each corner portion of the half plate 62 in the same manner as the second embodiment.

In accordance with the guide plate 61 of the board supporting mechanism according to the third embodiment, both of the effects of a plastic material that is light weight and less susceptible to secular changes and an elastic body that makes the insertion and holding process of the support pins 42 easier can be utilized so that it becomes possible to supply a guide plate that is superior in operability upon setup.

The above descriptions have discussed the board supporting mechanisms according to the respective embodiments of the present invention. The present invention also includes the guide plates 41, 51 and 61 as well as support pins 42, which are constituent elements of the board supporting mechanism 7. The present invention further includes a board supporting method in which: one end of each of the support pins 42 is brought into contact with the surface of the support table 27 so that the surface of the support table 27 is used as a reference face of the support height "H", and by elastically holding the support pins 42 with a guide plate 41, 51 or 61 made of an elastic body having a predetermined thickness, the circuit board 14 is supported from a bottom side thereof. In addition, the present invention includes a component mounting apparatus and a viscous material applying apparatus, which utilize the aforementioned board supporting mechanism, and a component mounting method and a viscous material applying method, which utilize the aforementioned board supporting method.

The board supporting mechanism and the board supporting method, and the pin-erecting guide plate and support pin used in the board supporting mechanism and board supporting method of the present invention can be widely utilized in the industrial field of component-mounting in which a circuit board is supported from a bottom side thereof so that electronic components and the like are mounted on the circuit board, or a viscous material such as cream solder or adhesive is applied onto the surface of the circuit board.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A board supporting method for supporting a circuit board, held by a board holding device, from a bottom side thereof for processing the circuit board, the method comprising:

securing at least one positioning pin on a surface of a support table;

bringing one end of at least one support pin into contact with the surface of the support table for raising/lowering the support pin;

bringing the other end of the support pin into contact with a bottom face of the circuit board to support the bottom face of the circuit board; and holding the support pin in a direction substantially perpendicular to the surface of the support table;

wherein the support pin is inserted into and passes through a pin-erecting through-hole of a pin-erecting guide plate positioned on the surface of the support table so that the support pin is held in a position substantially perpendicular to the pin-erecting guide plate, wherein the pin-erecting guide plate is made of any one of an elastic body, a plastic material, and a combination of an elastic body and a plastic material, and the support pin is held substantially perpendicular to the support table by an elastic force of the pin-erecting guide plate, and wherein the at least one positioning pin is erected on the surface of the support table prior to the positioning of the pin-erecting guide plate on the support table, and the positioning pin is fitted into a positioning hole formed in the pin-erecting guide plate, so that the pin-erecting guide plate is fixedly positioned onto the support table.

2. A viscous material applying method for applying a viscous material supplied from a viscous material supplying section onto a position-held circuit board, the method comprising:

supporting the circuit board by bringing one end of at least one support pin into contact with a bottom face of the circuit board to support the bottom face of the circuit board, bringing the other end of the support pin into contact with a surface of a support table for raising/lowering the support pin, and holding the support pin in a direction substantially perpendicular to the surface of the support table for supporting the circuit board; and applying a viscous material to the position-held circuit board.

3. A pin-erecting guide plate for holding at least one support pin such that one end of the support pin is brought into contact with a surface of a raising/lowering support table and the other end is brought into contact with a bottom face of a circuit board held by a board holding device above the support table to hold the circuit board from a bottom side thereof, the support pin being held substantially perpendicular to the surface of the support table, and secured onto the surface of the support table, the pin-erecting guide plate being formed from a box-shaped member made of a plastic material, the box-shaped member being open on one side thereof and closed by a planar portion forming a bottom of the box-shaped member, the pin-erecting guide plate comprising a plurality of tubular holder portions each passing through the planar portion of the box-shaped member and extending in the direction substantially perpendicular from the planar portion toward the open side of the box-shaped member, and each of the plurality of tubular holder portions being capable of holding the support pin therein, wherein the support pin inserted into one of the holder portions is brought into contact with the surface of the support table so that the support pin is held substantially perpendicular to the surface of the support table.

4. The pin-erecting guide plate according to claim 3, wherein the holder portion includes one of a slit extending along at least a part of the holder portion in a longitudinal direction thereof and a rib extending along at least a part of inside of the holder portion in the longitudinal direction or both the slit and the rib, and the holder portion restricts the support pin from moving in an axial direction thereof and in a direction orthogonal to the axial direction to hold the support pin.

5. A pin-erecting guide plate for holding at least one support such that one end of the support pin can be brought into contact with a surface of a raising/lowering support table and the other end can be brought into contact with a bottom face of a circuit board held by a board holding device above the support table to support the circuit board from a bottom side thereof, the support pin being held in a direction substantially perpendicular to the surface of the support table, and secured to the surface of the support table, the pin-erecting guide plate comprising:

a pair of box-shaped members made of a plastic material, each of the box-shaped members being open on a top side thereof and closed by a planar portion on a bottom side thereof, the planar portions of the box-shaped members provided in parallel with the surface of the support table and facing each other, each box-shaped member including a plurality of tubular holder portions each capable off holding the support pin therein, each box-shaped member being arranged in such a manner that the openings at the top portion of each of the box-shaped members face each other and the plurality of holder portions of each the box-shaped members face each other in one to one correspondence; and an elastic member sandwiched between the pair of box-shaped members and between the ends of holder portions facing each other, wherein the elastic member has a communication holding hole for elastically holding the support pin inserted into a pair of the holding portions, facing each other, of the pair of box-shaped members so that the support pin can be brought into contact with the surface of the support table.

6. A pin-erecting guide plate for holding at least one support pin such that one end of the support pin can be brought into contact with a surface of a raising/lowering support table and the other end can be brought into contact with a bottom face of a circuit board held by a board holding device above the support table to hold the circuit board from a bottom side thereof, the support pin being held substantially perpendicular to the surface of the support table, and secured onto the surface of the support table, the pin-erecting guide plate being made of an elastic plate-shaped member, wherein the pin-erecting guide plate comprises:

a plurality of pin-erecting through-holes each formed so as to pass through top and bottom faces of the elastic plate-shaped member, each of the through holes being capable of holding the support pin inserted therein and passing therethrough with an elastic force of the elastic plate-shaped member, and a positioning hole for receiving a positioning pin that is erected on the surface of the support table prior to the positioning of the pin-erecting guide plate on the support table, to fixedly position the pin-erecting guide plate onto the support table.

7. A viscous material applying apparatus comprising:

a viscous material supplying section for supplying a viscous material;

an applying head section for dispersing the viscous material to apply the viscous material onto a circuit board;

a driving section for driving the applying head section; and a board supporting device for transporting and positioning the circuit board, so that the viscous material is applied to the circuit board by the applying head section, wherein the board supporting device comprises a board supporting mechanism for supporting the circuit board held by the board supporting device from a bottom side thereof for processing of the circuit board, the board supporting mechanism comprising:

a support pin for contacting a bottom face of the circuit board to support the circuit board;

a support table for supporting the support pin and raising/lowering the support pin; and a pin-erecting guide plate, secured to a surface of the support table, for holding the support pin in a direction substantially perpendicular to the surface of the support table, wherein the pin-erecting guide plate comprises:

an elastic plate-shaped member; and a plurality of pin-erecting through-holes each formed so as to pass through top and bottom faces of the elastic plate-shaped member, each of the pin-erecting through-holes being adapted to hold the support pin inserted therein and passing therethrough with an elastic force of the elastic plate-shaped member.

* * * * *